US010483103B2

(12) United States Patent
De Mierry et al.

(10) Patent No.: US 10,483,103 B2
(45) Date of Patent: Nov. 19, 2019

(54) METHOD FOR MANUFACTURING A SEMICONDUCTOR MATERIAL INCLUDING A SEMI-POLAR III-NITRIDE LAYER

(71) Applicant: Centre National De La Recherche Scientifique (CNRS), Paris (FR)

(72) Inventors: Philippe De Mierry, Valbonne (FR); Florian Tendille, Mougins (FR); Philippe Vennegues, Antibes (FR)

(73) Assignee: CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 9 days.

(21) Appl. No.: 15/311,816

(22) PCT Filed: May 20, 2015

(86) PCT No.: PCT/EP2015/061132
§ 371 (c)(1),
(2) Date: Nov. 16, 2016

(87) PCT Pub. No.: WO2015/177220
PCT Pub. Date: Nov. 26, 2015

(65) Prior Publication Data
US 2017/0092482 A1 Mar. 30, 2017

(30) Foreign Application Priority Data
May 20, 2014 (FR) ..................... 14 54507

(51) Int. Cl.
*H01L 21/02* (2006.01)
*C30B 25/04* (2006.01)
(Continued)

(52) U.S. Cl.
CPC .......... *H01L 21/0254* (2013.01); *C30B 23/04* (2013.01); *C30B 23/066* (2013.01);
(Continued)

(58) Field of Classification Search
CPC ............ H01L 21/0254; H01L 21/0262; H01L 21/02639; H01L 21/02513
See application file for complete search history.

(56) References Cited

U.S. PATENT DOCUMENTS

2009/0197118 A1* 8/2009 Nagai .................... C30B 25/18
428/698
2011/0068347 A1* 3/2011 Strittmatter ....... H01L 21/02389
257/76

FOREIGN PATENT DOCUMENTS

GB       2 502 818 A       12/2013
WO    WO2013/182854      * 12/2013

OTHER PUBLICATIONS

Okada et al. "Growth of Semipolar GaN Layer by Controlling Anisotropic Growth Rates in r-plane Patterned Sapphre Substrate." Applied Physics Express vol. 2, No. 9 (2009). pp. 091001-1 through 091001-3 (3 pages).
(Continued)

*Primary Examiner* — Kyoung Lee
*Assistant Examiner* — Christina A Sylvia
(74) *Attorney, Agent, or Firm* — Womble Bond Dickinson (US) LLP

(57) ABSTRACT

The present invention relates to a method for manufacturing a semiconductor material including a semi-polar III-nitride layer from a semi-polar starting substrate including a plurality of grooves periodically spaced apart, each groove including a first inclined flank of crystallographic orientation C (0001) and a second inclined flank of different crystallographic orientation, the method comprising the phases consisting in:
   forming (2) III-nitride crystals on the first inclined flanks of the grooves, the growth parameters of the III-nitride crystals being adapted to favor lateral growth of said crystals such as to induce overlapping between adjacent
(Continued)

III-nitride crystals, and continuing growth until coalescence of the III-nitride crystals to form a layer of coalesced III-nitride crystals;

forming (3) a two-dimensional III-nitride layer on the layer of coalesced III-nitride crystals.

23 Claims, 16 Drawing Sheets

(51) Int. Cl.
| | |
|---|---|
| C30B 25/18 | (2006.01) |
| C30B 29/40 | (2006.01) |
| C30B 23/04 | (2006.01) |
| C30B 23/06 | (2006.01) |
| C30B 29/66 | (2006.01) |
| H01L 33/00 | (2010.01) |
| H01L 33/32 | (2010.01) |

(52) U.S. Cl.
CPC ............ *C30B 25/04* (2013.01); *C30B 25/186* (2013.01); *C30B 29/406* (2013.01); *C30B 29/66* (2013.01); *H01L 21/0242* (2013.01); *H01L 21/0243* (2013.01); *H01L 21/0262* (2013.01); *H01L 21/0265* (2013.01); *H01L 21/02433* (2013.01); *H01L 21/02458* (2013.01); *H01L 21/02513* (2013.01); *H01L 21/02516* (2013.01); *H01L 21/02639* (2013.01); *H01L 33/007* (2013.01); *H01L 33/32* (2013.01)

(56) References Cited

OTHER PUBLICATIONS

Okada et al. "Growth Mechanism of Nonpolar and Semipolar GaN Layers from Sapphire Sidewalls on Various Maskless Patterned Sapphire Substrates." Japanese Journal of Applied Physics 50 (2011). pp. 035602-1 through 035602-7 (7 pages).

Schwaiger et al. "Growth and coalescence behavior of semipolar GaN on pre-structured r-plane sapphire substrates." Phys. Status Solidi B. 248, No. 3 (2011). pp. 588-593.

Imer et al. "Improved Quality a-plane GaN with Sidewall Lateral Epitaxial Overgrowth." Applied Physics Letters 88, 061908 (2006). pp. 061908-1 through 061908-3 (3 pages).

De Mierry et al. "Improved Semipolar GaN Quality using Asymmetric Lateral Epitaxy." Applied Physics Letters 94, 191903 (2009). pp. 191903-1 through 191903-3 (3 pages).

Hollander et al. "Improvements in a-plane GaN Crystal Qaulity by a Two-Step Growth Process." Appl. Phys. Lett. 92, 101104 (2008). 4 pages.

Chen. "Investigation on microstructure in GaN epitaxial growth on the stripe-patterned r-plane sapphire substrates." Journal of Crystal Growth 310 (2008). pp. 1627-1631.

De Mierry et al. "Semipolar GaN Films on Patterned r-plane Sapphire Obtained by Wet Chemical Etching." Applied Physics Letters 96, 231918 (2010). pp. 231918-1 through 231918-3 (3 pages).

Sholz. "Semipolar GaN Grown on Foreign Substrate: a Review." Semicond. Sci. Technol. 27 (2012). 15 pages.

Iida. "Sidewall Epitaxial Lateral Overgrowth of Nonpolar a-plane GaN by Metalorganic Vapor Phase Epitaxy." Phys. Stat. Sol. (c) 5, No. 6 (2008). pp. 1575-1578.

International Search Report in PCT/EP2015/061132 dated Aug. 20, 2015, with English translation. 8 pages.

Search Report in French Application No. 1454507 dated Jan. 30, 2015, with English translation coversheet. 3 pages.

Yoo et al. A Nonpolar a-Plane GaN Grown on a Hemispherical Patterned r-Plane Sapphire Substrate. Japanese Journal of Applied Physics 50 (2011). pp. 042103-1 through 042103-4 (4 pages.).

\* cited by examiner

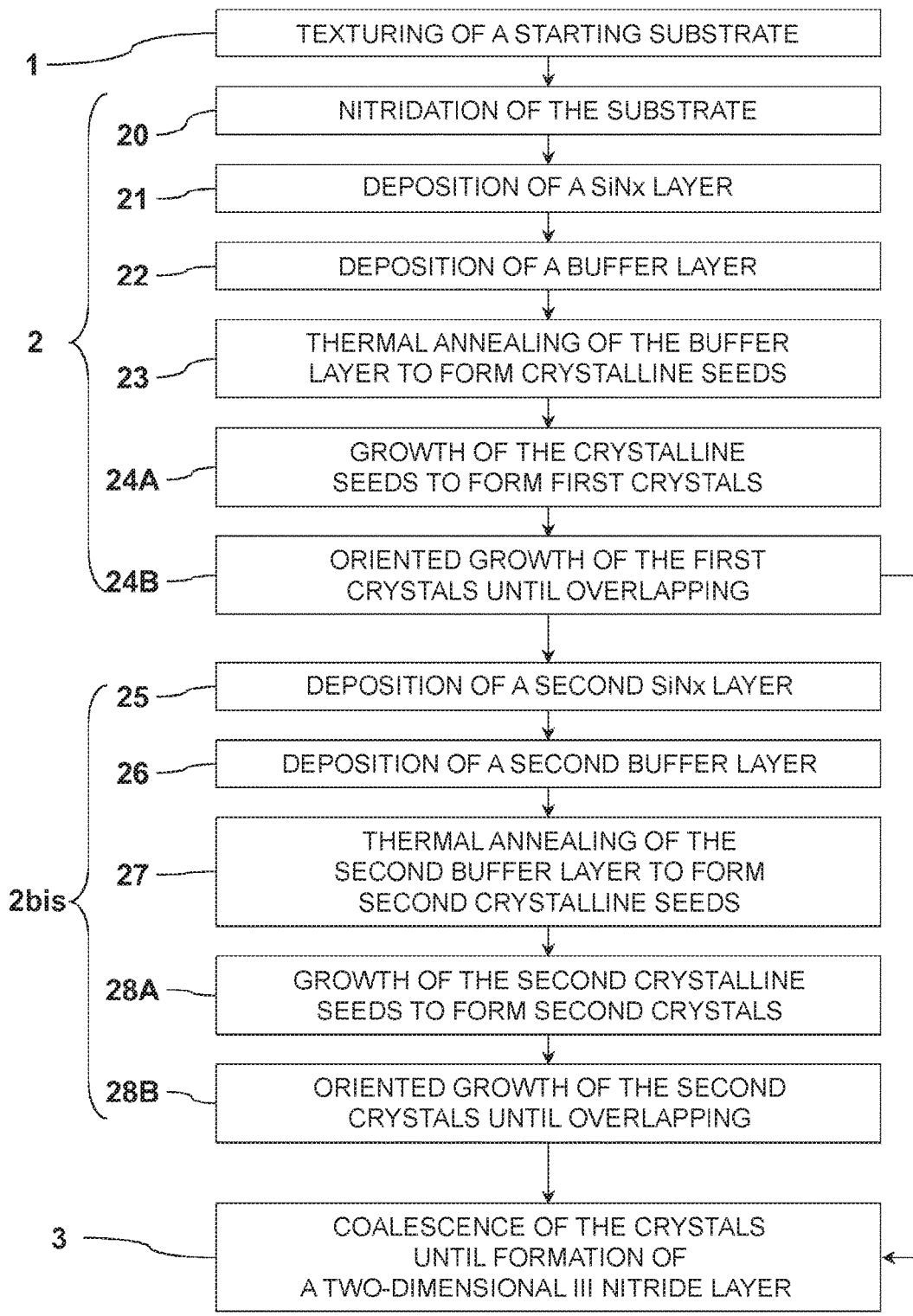

FIG 2a
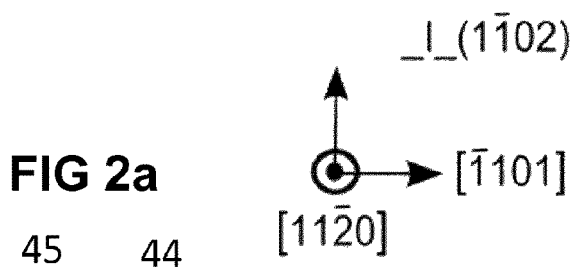
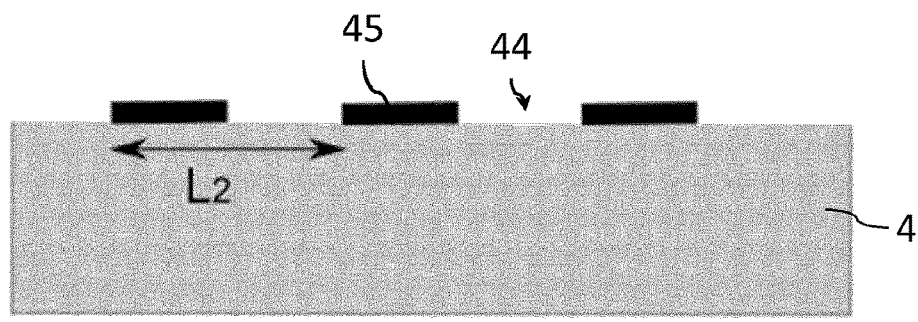
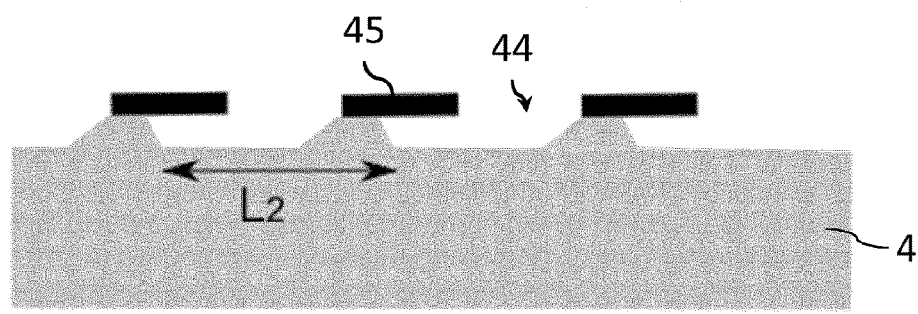
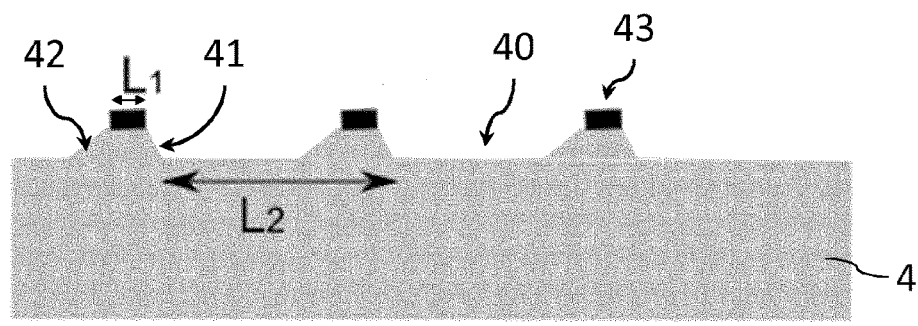

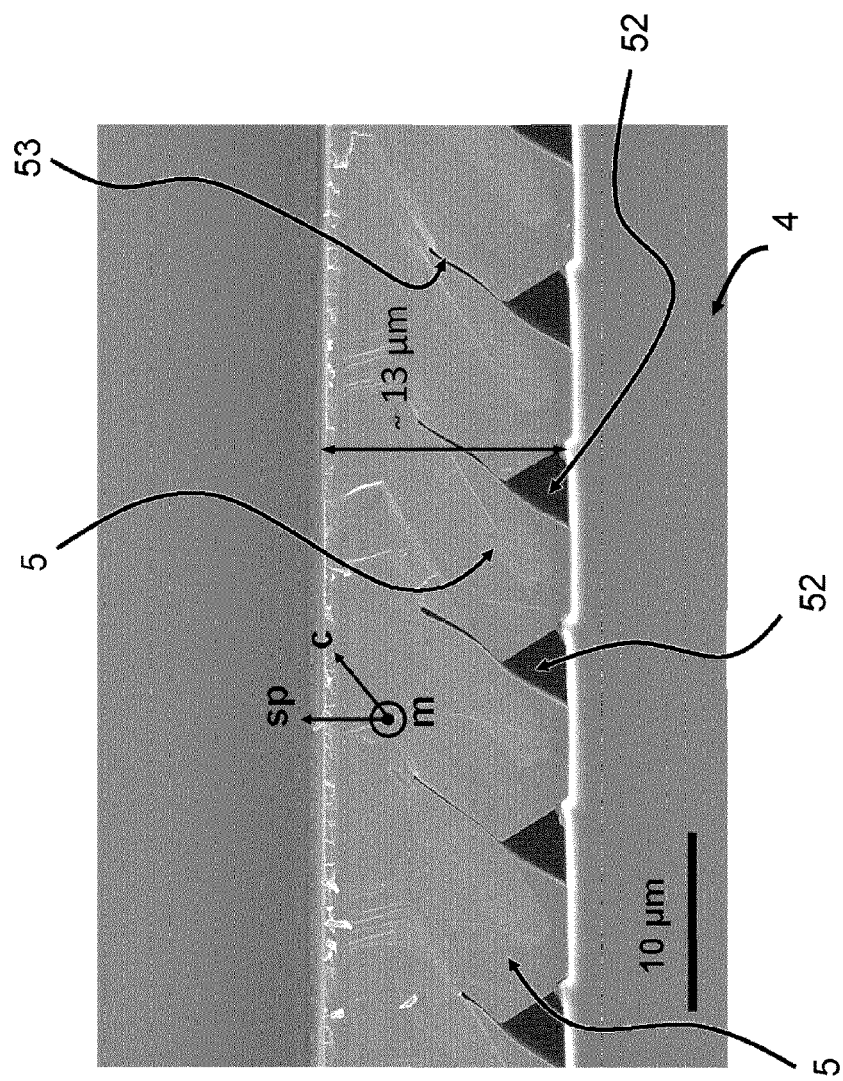

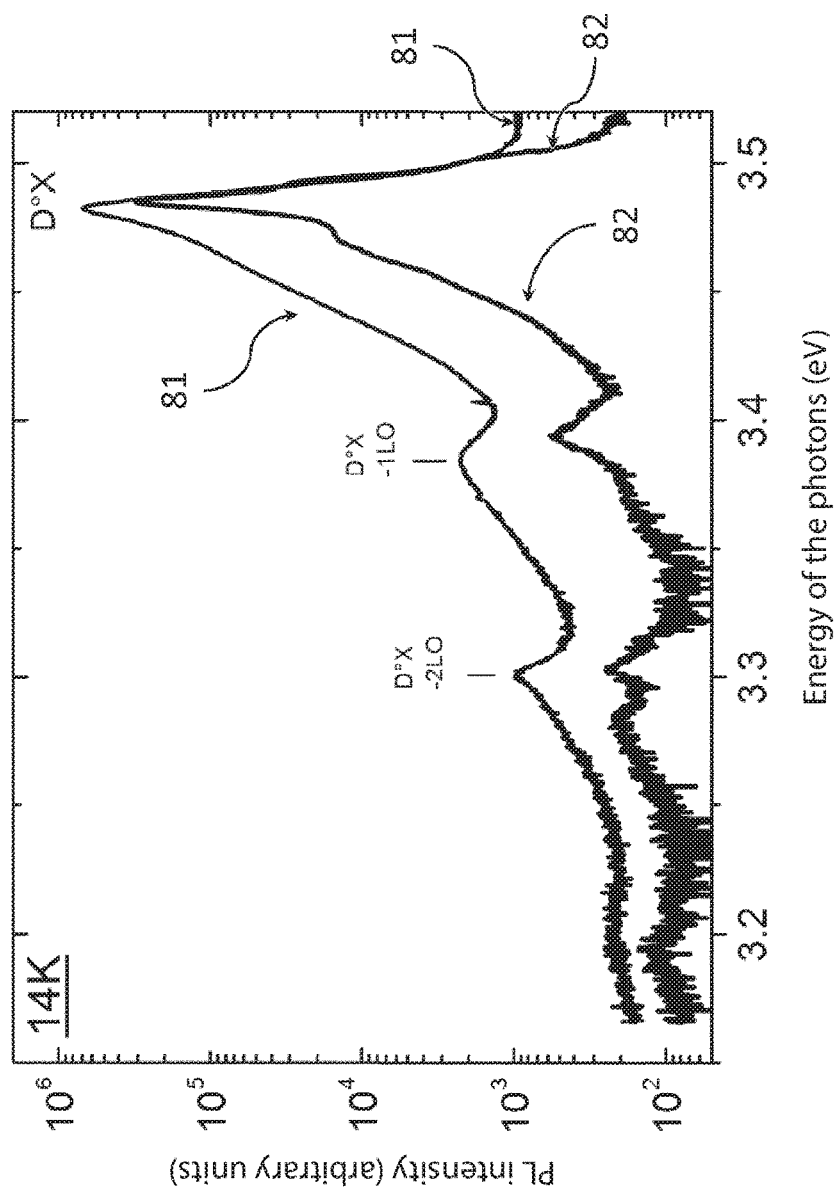

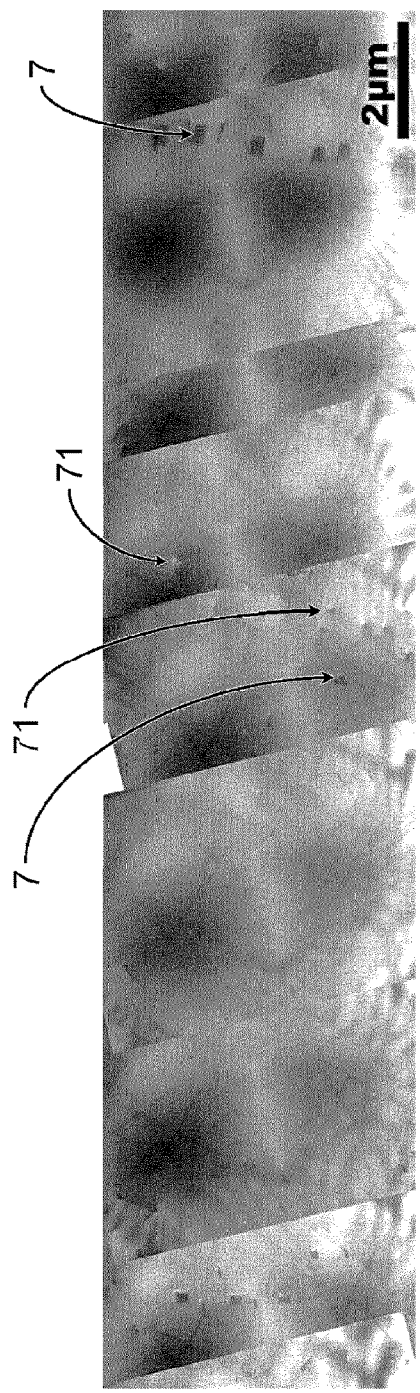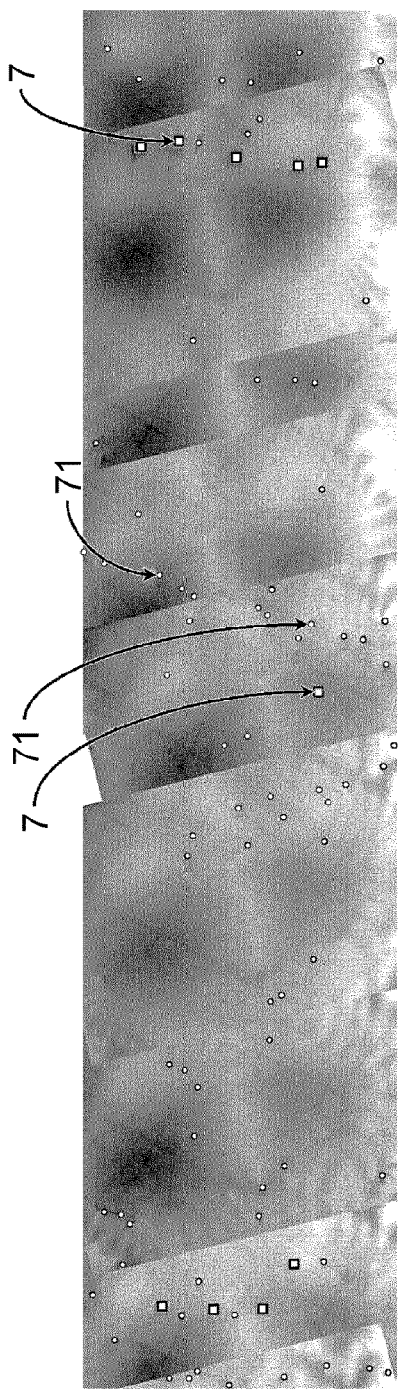

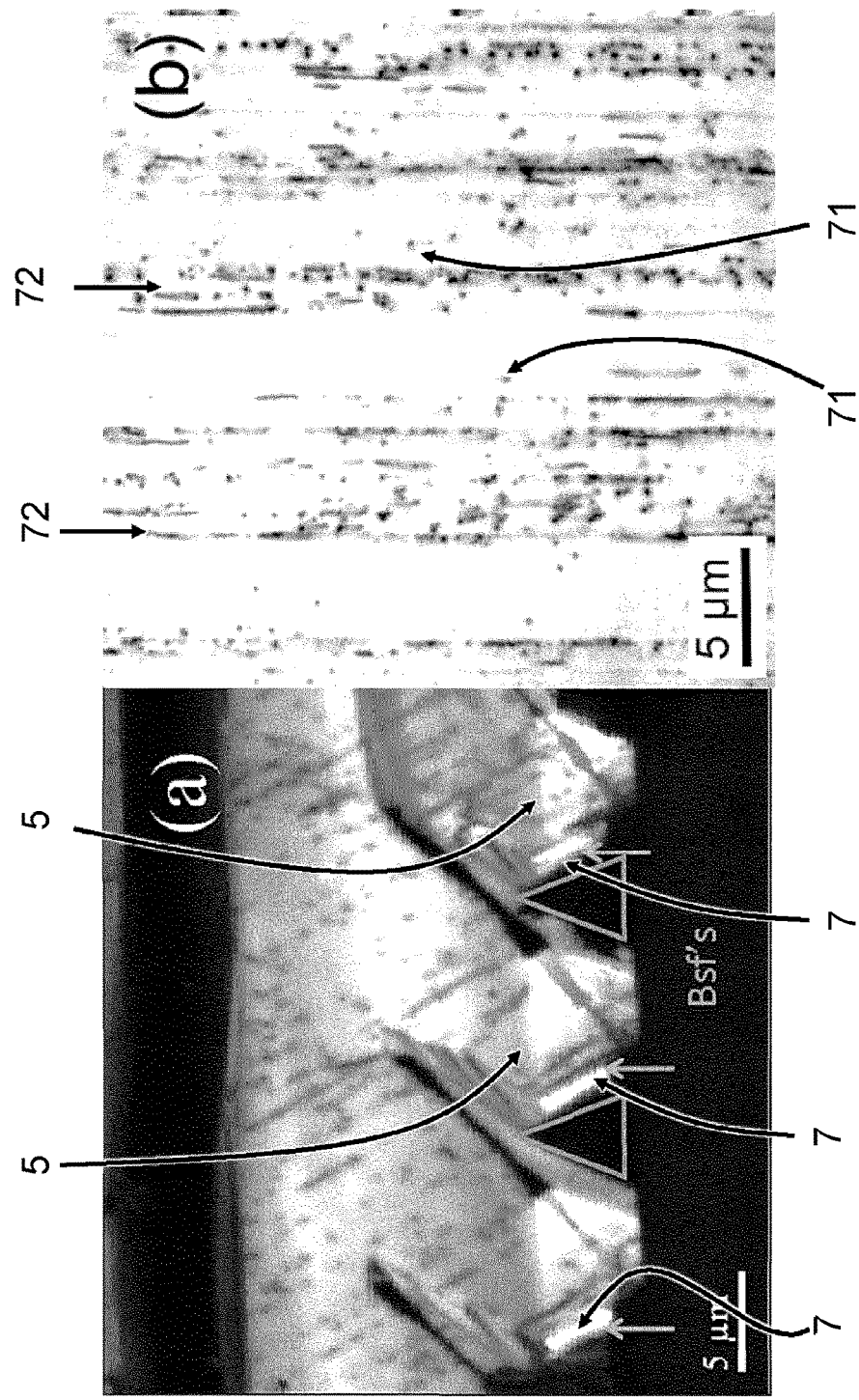

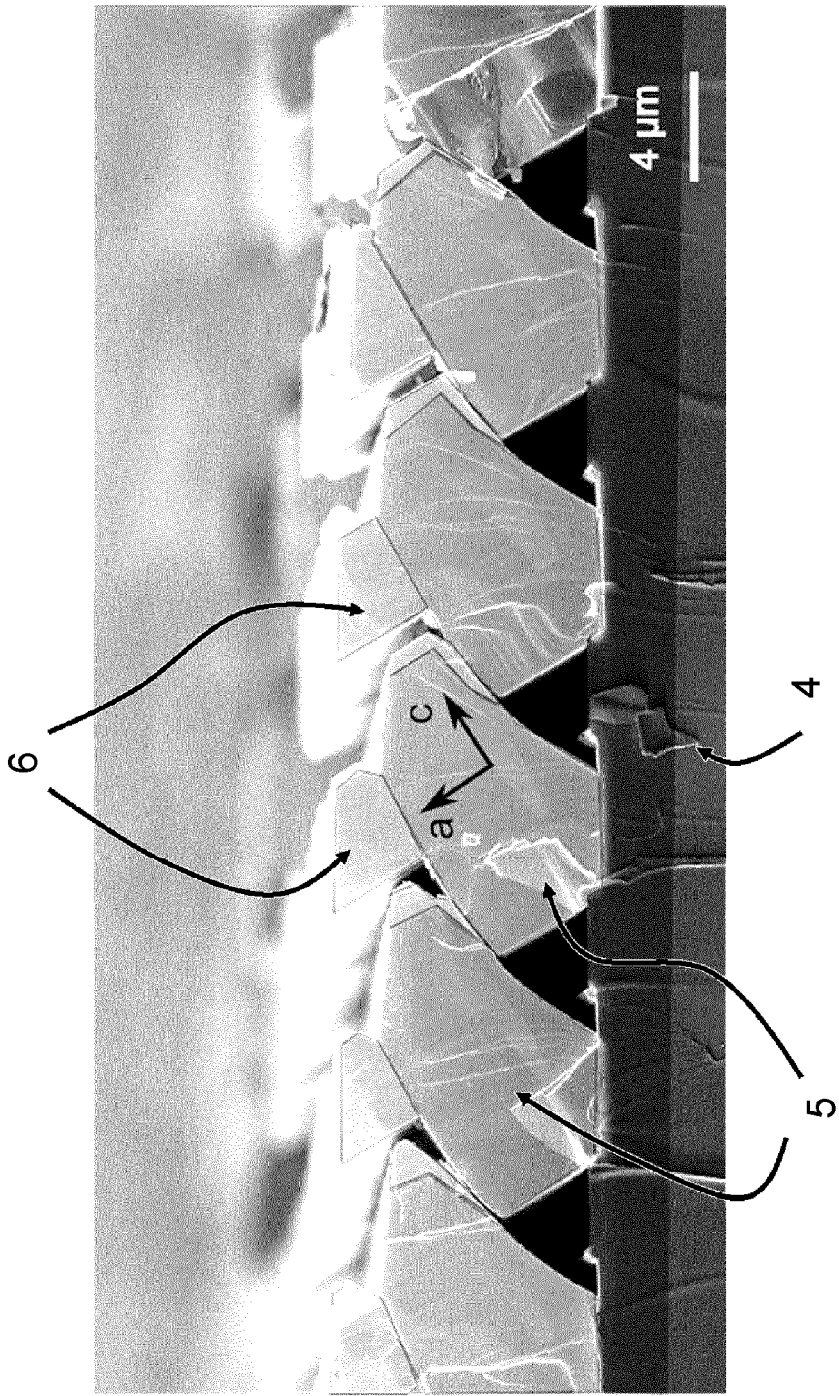

METHOD FOR MANUFACTURING A SEMICONDUCTOR MATERIAL INCLUDING A SEMI-POLAR III-NITRIDE LAYER

TECHNICAL FIELD

The invention relates to the general technical field of the manufacture of a semiconductor material including a semi-polar layer of nitride of elements of group III of the periodic table—such as a layer of gallium nitride.

Notably, the present invention relates to the manufacture of wafers of semiconductor material—of large surface area and including a semi-polar gallium nitride layer.

Such a semiconductor material may be intended for the production of semiconductor structures such as light emitting diodes (LED) or laser diodes (LD).

DESCRIPTION OF THE PRIOR ART

Semiconductor materials based on nitrides of elements of group III of the periodic table occupy an increasingly important place in the electronics and optoelectronics fields, notably for the manufacture of semiconductor components such as light emitting diodes (LED) or laser diodes (LD).

Current methods for manufacturing III-nitride based semiconductor materials rely on the so-called hetero-epitaxy technique which consists in growing a crystal—such as a crystal of gallium nitride GaN—on a starting substrate of different nature—such as a sapphire substrate.

Nevertheless, the hetero-epitaxy technique induces numerous crystal defects in the III-nitride structure, such as dislocations, limiting the performances and the lifetime of III-nitride based components.

These defects arise from the difference in material between the starting substrate (on which the growth of III-nitride is implemented) and the III-nitride layer from which the semiconductor component is manufactured.

For example, in the case of the manufacture of a layer of gallium nitride (GaN), the starting substrate generally used for growth is sapphire of which the crystal lattice parameters (i.e. cell parameters) and the thermal expansion parameters are very different to those of GaN.

Improvements in manufacturing techniques now make it possible to manufacture GaN layers having a limited number of crystal defects (threading dislocation density TDD<$5 \times 10^8$ cm$^{-2}$).

Most current manufacturing methods make it possible to obtain GaN layers of orientation C (0001)—called polar. In fact, these manufacturing methods use sapphire Al2O3 substrates of orientation C (0001) to grow the GaN layers.

Optoelectronic components produced on GaN layers of polar orientation are subjected to polarisation effects due, among other things, to the non-ideal hexagonal structure of the material (c/a ratio different to 1.633) and to the ionic character of the Ga—N bond. This considerably reduces the efficiency of these optoelectronic components, such as the internal quantum efficiency of a light emitting diode (LED) produced on a polar GaN layer.

For some years, numerous research groups have concerned themselves with other crystalline orientations (semi-polar orientation) to eliminate partially these polarisation effects.

Nevertheless, even if the growth of a GaN layer on a sapphire Al2O3 substrate of orientation different to C (0001) makes it possible to obtain a GaN layer of semi-polar or non-polar orientation, the crystalline quality of such a semi-polar GaN layer is not sufficient to enable the manufacture of optoelectronic components, notably due to the presence of stacking faults (BSF). With the aim of reducing the defect density of the semi-polar or non-polar GaN, the technique of epitaxial lateral overgrowth (ELO) has been developed, as described in the articles:

- "Improved quality (11$\bar{2}$0) a-plane GaN with sidewall lateral epitaxial overgrowth" by Imer B., Wu F., DenBaars S. and Speck J., 2006 Appl. Phys. Lett. 88 061908;
- "Sidewall epitaxial lateral overgrowth of nonpolar a-plane GaN by metalorganic vapor phase epitaxy", by Iida D, Kawashima T., Iwaya M., Kamiyama S., Amano H. and Akasaki I., 2008 Phys. Stat. Sol. c 5 1575;
- "Improvements in a-plane GaN crystal quality by a two-step growth process" by Hollander J. L., Kappers M. J., McAleese C. and Humphreys C. J 2008 Appl. Phys. Lett. 92 101104;
- "Improved semipolar (11$\bar{2}$2) GaN quality using asymmetric lateral epitaxy", by de Mierry P., Kriouche N., Nemoz M. and Nataf G. 2009 Appl. Phys. Lett. 94 191903.

Similarly, a technique of selective area growth (SAG) epitaxy from textured substrates has been developed, as described in the articles:

- "Investigation on microstructure in GaN epitaxial growth on the stripe-patterned r-plane sapphire substrates", by Chen H. G., Ko T. S., Chang L., Wu Y. H., Lu T. C., Kuo H. C. and Wang S. C. 2008 J. Cryst. Growth 310 1627;
- "Growth and coalescence behavior of semipolar (11$\bar{2}$2) GaN on pre-structured r-plane sapphire substrates", by Schwaiger S., Metzner S., Wunderer T., Argut I., Thalmair J., Lipski F., Wieneke M., Biasing J., Bertram F., Zweck J., Krost A., Christen J. and Scholz F. 2011 Phys. Stat. Sol. b 248 588;
- "Semipolar GaN films on patterned r-plane sapphire obtained by wet chemical etching", de Mierry P., Kriouche N., Nemoz M., Chenot S. and Nataf G. 2010 Appl. Phys. Lett. 96 231918;
- "Growth Mechanism of Nonpolar and Semipolar GaN Layers from Sapphire Sidewalls on Various Maskless Patterned Sapphire Substrates", by Okada N., Oshita H., Kurisu A. and Tadatomo K. 2011 Jpn. J. Appl. Phys. 50 035602";
- "A Nonpolar a-Plane GaN Grown on a Hemispherical Patterned r-Plane Sapphire Substrate", by Yoo G., Park H., Lim H., Lee S, Nam O., Moon Y., Lim C., Kong B. and Cho H. 2011 Jpn. J. Appl. Phys. 50 042103;
- "Semipolar GaN grown on foreign substrates: a review", by Scholz F. 2012 Semicond. Sci. Technol. 27 024002;
- "Growth of Semipolar (11$\bar{2}$2) GaN Layer by Controlling Anisotropic Growth Rates in r-Plane Patterned Sapphire Substrate", by Okada N., Kurisu H. and Tadatomo K. 2009 Appl. Phys. Exp. 2 091001.

These techniques, although bringing improvements to the structural quality of the semi-polar GaN layers, do not make it possible to attain the quality of polar GaN.

Like these, and as an example, the document GB 2 502 818 proposes producing nano-pillars in order to obtain lateral and localised growth of GaN crystals. Said crystals join up by coalescence leaving triangular cavities between the mask and their junction point. However, defects propagate between the crystals, and the quality of the layers obtained is not optimal.

At the present time, the only method making it possible to obtain a semi-polar GaN layer, of which the quality is close to that of polar GaN layers, consists in:

growing a very thick polar GaN layer, transversally cutting the polar GaN layer to obtain a trench of semi-polar GaN, and polishing the trench of semi-polar GaN.

This method makes it possible to obtain trenches of semi-polar GaN of surface area between 1 and 5 cm$^2$, these trenches having a quality substantially identical to that of polar GaN layers. Nevertheless, the small dimensions of these trenches do not enable industrialisation of this method.

An aim of the present invention is to propose a method for manufacturing semi-polar III-nitride layers:

having the same dimensions as polar III-nitride layers, and having a quality substantially equivalent or even greater than that of polar III-nitride layers.

SUMMARY OF THE INVENTION

To this end, the invention proposes a method for manufacturing a semiconductor material including a semi-polar III-nitride layer from a starting substrate including a plurality of grooves periodically spaced apart by a distance L2, each groove including a first inclined flank of crystallographic orientation C (0001) and a second inclined flank of different crystallographic orientation, the method comprising the phases consisting in:

forming first III-nitride crystals on the first inclined flanks of the grooves, the growth parameters of the III-nitride crystals being adapted to favour lateral growth of said crystals such as to induce overlapping between adjacent III-nitride crystals and to form cavities in line with the overlapping areas between the first crystals;

forming a two-dimensional III-nitride layer on the III-nitride crystals formed beforehand.

Preferred but non-limiting aspects of the method described above are the following:

the method further comprises a phase consisting in forming second crystals on the first crystals, the growth parameters of the second III-nitride crystals being adapted to favour lateral growth of said second crystals such as to induce overlapping between adjacent second III-nitride crystals and to form cavities in line with the overlapping areas of the second crystals;

the growth of the III-nitride crystals is carried out by metal organic vapour phase epitaxy MOVPE or by hydride vapour phase epitaxy HVPE, and the formation of a two-dimensional III-nitride layer is carried out by metal organic vapour phase epitaxy MOVPE, by hydride vapour phase epitaxy HVPE or by molecular beam epitaxy;

the method further comprises a phase consisting in texturing the starting substrate, said phase including a step consisting in forming the plurality of grooves in the starting substrate;

the step consisting in forming the plurality of grooves comprises the sub-steps of:

depositing a mask of period L2 including openings;

annealing the starting substrate comprising the mask at a temperature greater than 900° C. under atmosphere comprising ammonia NH3 and/or a dihydrogen-dinitrogen H2/N2 mixture, prior to chemical etching in an acid bath, etching the starting substrate through the openings of the mask, by introduction of the starting substrate in an acid bath to form the grooves;

the etching sub-step comprises:

dry etching the substrate by reactive ion etching, preceded by or followed by annealing under NH3, H2, N2, and wet etching the substrate at a temperature between 240 and 280° C.;

the parameters of the step of etching the substrate are adapted to form grooves of width greater than the initial openings, thanks to lateral abrasion under the mask to form abraded areas, said grooves each including a first inclined flank of crystallographic orientation C (0001) and a second inclined flank of crystallographic orientation different to a plane C (0001), for example a plane ($1\bar{1}01$) in the case of sapphire r;

the parts of the mask overhanging the abraded areas are removed by a cleaning procedure comprising treatment in an ultrasound bath, in such a way that at the end of the cleaning procedure, the substrate comprises on its surface strips of mask with substantially vertical flanks and grooves;

the sub-step of depositing a mask comprises the deposition of a dielectric layer, such as a layer of SiOx, or SiNx, or a metal layer, and etching the mask, for example by photolithography, to form openings;

the thickness of the mask layer is between 200 nm and 100 micrometers such as to block crystal defects generated from the inclined flanks i;

the phase consisting in forming first crystals comprises the steps consisting in:

depositing a III-nitride buffer layer.

thermally annealing the buffer layer such as to bring about the solid phase migration of the buffer layer to the first inclined flank of orientation C of each groove and thus forming first seeds;

the step consisting in depositing a buffer layer comprises the deposition by metal organic vapour phase epitaxy MOVPE of a III-nitride layer at a temperature less than 750° C.;

the step consisting in thermally annealing the buffer layer is implemented at a temperature greater than 950° C. under atmosphere comprising hydrogen to create first seeds of crystallographic orientation C (0001) on the first flanks of the grooves;

the phase consisting in forming first crystals comprises a step consisting in growing first crystals on the first seeds;

the step consisting in growing first crystals is implemented at a temperature between 900° C. and 1300° C., at a pressure between $0.2\times10^5$ Pa and $1\times10^5$ Pa;

the phase consisting in forming first crystals comprises a step of oriented growth to favour a rate of growth of first crystals along the crystallographic planes (0001) greater than the rates of growth of first crystals along planes perpendicular to (0001), such as the crystallographic planes ($11\bar{2}0$);

the step of oriented growth is carried out at a pressure between $0.03\times10^5$ Pa and $0.5\times10^5$ Pa, at a temperature between 900° C. and 1300° C. and with a V/III ratio between 250 and 3000;

the phase consisting in forming second III-nitride crystals comprises the steps consisting in:

depositing a second SiNx layer on the pre-existing first crystals, by exposure to silane and NH3, at a temperature greater than 950° C., depositing a second III-nitride buffer layer on the second SiNx layer, thermally annealing the second buffer layer such as to bring about the solid phase migration of the buffer layer to the faces a (11$\bar{2}$0) and c (0001) of the crystals, and thus to form second seeds;

the step consisting in depositing a second buffer layer comprises the deposition by metal organic vapour phase epitaxy EVPOM of a III-nitride layer at a temperature less than 750° C.;

the step consisting in thermally annealing the buffer layer is implemented at a temperature greater than 950° C. under atmosphere comprising hydrogen to create second seeds on the faces a (11$\bar{2}$0) and c (0001) of the crystals;

the phase consisting in forming second crystals comprises a step consisting in growing second crystals on the second seeds;

the step consisting in growing second crystals is implemented at a temperature between 900° C. and 1300° C., at a pressure between 0.2×10$^5$ Pa and 1×10$^5$ Pa;

the phase consisting in forming second crystals comprises a step of growth oriented to favour a rate of growth of second crystals along the crystallographic planes (0001) greater than the rates of growth of second crystals along planes perpendicular to (0001), such as the crystallographic planes (11$\bar{2}$0);

the step of oriented growth is carried out at a pressure between 0.03×10$^5$ Pa and 0.5×10$^5$ Pa, at a temperature between 900° C. and 1300° C., and with a V/III ratio between 250 and 3000;

the starting substrate is a sapphire substrate of crystallographic orientation r (1$\bar{1}$02);

the starting substrate is a sapphire substrate of crystallographic orientation r (1$\bar{1}$02) having a disorientation with respect to the nominal plane being able to be more or less 3°;

the III-nitride layer is a gallium nitride layer of semi-polar orientation (11$\bar{2}$2).

The invention also relates to a semiconductor material including a semi-polar GaN layer, self-supporting or epitaxied on an exogenous substrate, characterised in that the semiconductor material comprises a semi-polar GaN layer including coalesced III-nitride crystals, the adjacent III-nitride crystals overlapping.

Preferred but non-limiting aspects of the semiconductor material are the following:

the material comprises, after coalescence of the overlapping crystals, extended cavities between the crystals;

each extended cavity extends in line with overlapping areas between the crystals;

each extended cavity extends in a plane that overhangs at least the plane defined by the crystallographic facet (0001) of the substrate;

the III-nitride layer is characterised by a curve of X-ray diffraction intensity of the crystallographic planes {11-22} as a function of the incidence angle of the X-ray beam on these planes having a full width at half maximum less than 400 arc seconds;

the material is obtained by implementing the method according to the invention, said material having a dislocation density less than or equal to 1.3×10$^8$ cm$^{-2}$, preferably even less than 7×10$^7$ cm$^{-2}$;

the material is obtained by implementing the first phases of the method according to the invention, said material having a density of non-radiating centres measured by cathodoluminescence less than or equal to 1.1×10$^8$ cm$^{-2}$, preferably even less than 5×10$^7$ cm$^{-2}$;

the material is obtained by implementing the method according to the invention, said material having a stacking fault density determined by a transmission electron microscopy measurement less than or equal to 1×10$^3$ cm$^{-1}$, preferably less than or equal to 70 cm$^{-1}$.

BRIEF DESCRIPTION OF THE DRAWINGS

Other advantages and characteristics of the method according to the invention and the associated product will become clear from the description that follows of several variants of execution, given as non-limiting examples, from the appended drawings in which:

FIG. 1 illustrates an example of method for manufacturing a semiconductor material according to the invention, FIG. 2a schematically describes the different steps of texturing a starting substrate, notably a substrate of sapphire r, seen in transversal section, FIG. 2b schematically illustrates a mask in top view, before texturing, FIG. 6 is an SEM image in transversal section of a semi-polar GaN layer of orientation (11$\bar{2}$2) obtained after complete coalescence of the crystals of FIG. 5, FIG. 7 is a graph illustrating the photoluminescence spectra at 14K of a semi-polar GaN layer and a polar GaN layer, FIGS. 8a and 8b are cathodoluminescence images at 77K illustrating the luminescence emitted on the trench (FIG. 8a) and at the upper face (FIG. 8b) of a semi-polar GaN layer, FIG. 9 is a transmission electron microscopy (TEM) image of the surface of a semi-polar GaN layer, FIG. 10a) is a TEM image of an area situated directly in line with a coalescence cavity formed by the meeting of two adjacent GaN crystals, FIG. 10b) is a schematic diagram illustrating the curvature of dislocations in the first stages of growth of a GaN crystal, FIGS. 12 and 13 are SEM images illustrating a GaN layer including a superposition of first and second GaN crystals.

DETAILED DESCRIPTION OF THE INVENTION

Figure 2B:
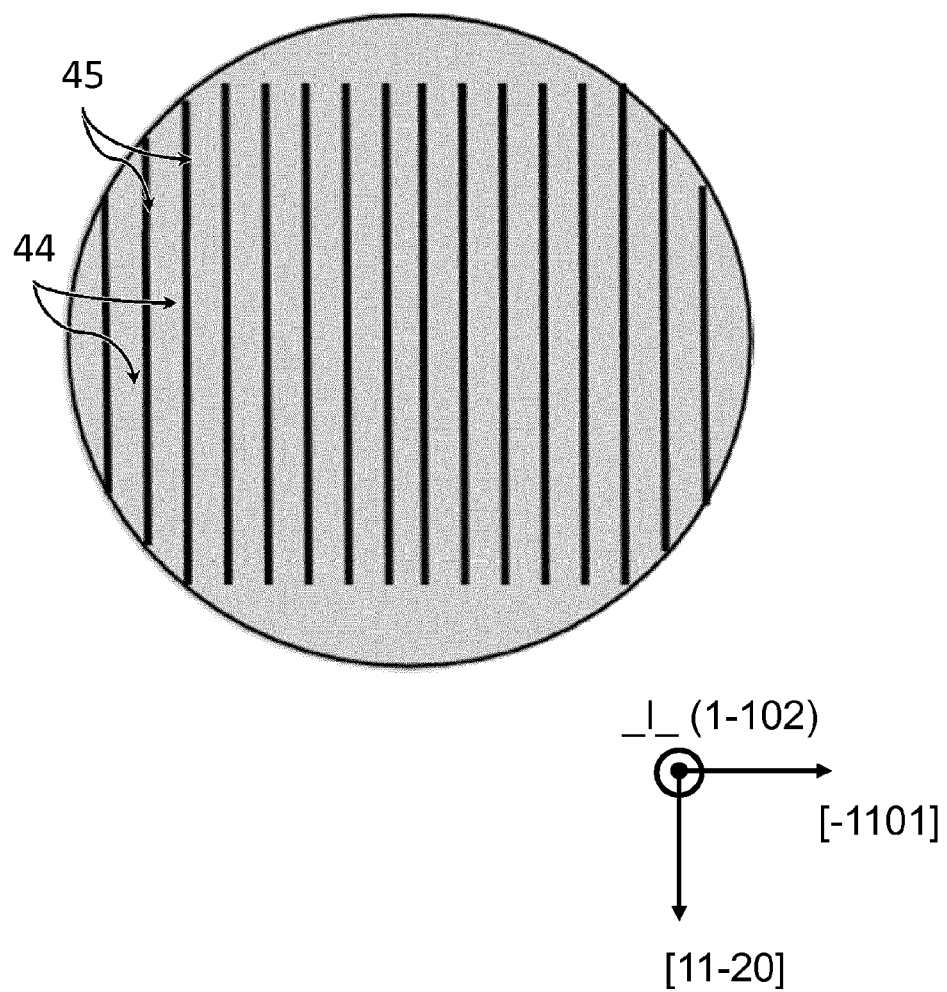

Examples of method for manufacturing a III-nitride based semiconductor material will now be described in detail.

The method will be described with reference to the manufacture of a semiconductor material including a layer of gallium nitride (hereafter designated "GaN").

Nevertheless, it is obvious for those skilled in the art that the method described hereafter may be used to grow a material including a III-nitride layer other than GaN, such as any alloy (Ga, Al, In, B)N, being able to be used to produce semiconductor structures such as light emitting diodes.

1. Manufacturing Method

With reference to FIG. 1, an example of method for manufacturing a semiconductor material including a GaN layer is illustrated.

The method comprises a phase 1 of texturing a starting substrate of sapphire type, a phase 2 of formation of first GaN crystals from the textured sapphire, potentially a phase 2bis of formation of second GaN crystals on the first GaN crystals, and a phase 3 of coalescence of the (first or second) crystals to form a two-dimensional GaN layer.

1.1. Texturing Phase

The aim of the texturing phase 1 is to create grooves 40 in the starting substrate 4, such as a sapphire substrate of crystallographic orientation r ($1\bar{1}02$). This substrate may potentially have a disorientation of more or less 3° with respect to the nominal orientation.

These grooves have inclined flanks comprising at least one facet enabling the growth of GaN (0001) according to epitaxy relations known to those skilled in the art.

Preferably, these grooves 40 are spaced apart periodically. This makes it possible to obtain a semiconductor material including a GaN layer of which the surfaces useful for the manufacture of semiconductor structures are regularly spaced apart, which facilitates the manufacture of said structures.

Each groove 40 comprises two inclined flanks 41, 42:
- a first inclined flank 41 of crystallographic orientation C (0001) favourable to the growth of GaN (0001), and
- a second inclined flank 42 of different crystallographic orientation (i.e. other than a plane C), for example of crystallographic orientation ($1\bar{1}01$) in the case of sapphire r.

The starting substrate 4 may be selected from among Si, AlN, GaN, GaAs, Al2O3 (sapphire), ZnO, SiC, LiAlO2, LiGaO2, MgAl2O4, 4H—SiC, or any other type of starting substrate known to those skilled in the art to implement growth of gallium nitride (0001) from an inclined flank of the substrate. It may have a thickness of several hundreds of micrometers, generally 350 m icrometers.

With reference to FIG. 2a, the texturing phase 1 comprises, in a first step, depositing a mask 45 in the form of strips, including openings 44, of period L2. The openings 44 of the mask 45 make it possible to define the positions of the grooves 40 to create in the starting substrate 4.

Advantageously, after this first step, the substrate may be annealed at a temperature greater than or equal to 900° C. in a gaseous environment comprising (H2, N2, NH3). This has the effect of favouring the formation of facets C (0001) perfectly oriented (notably with an angle of 58° with the surface of the substrate of sapphire r) in a reproducible manner during chemical etching.

The starting substrate 4 is then etched through the openings 44 to form grooves 40. This etching of the starting substrate 4 is for example implemented by introduction of the starting substrate 4 in an acid bath, for example of formula $H_3PO_4/H_2SO_4$ in 1:3 volume proportion taken to a temperature of 260° C.

This etching may also be implemented by a first dry etching of RIE (reactive ion etching) type followed by the introduction of the starting substrate 4 in the acid bath, for example that cited previously, taken to a temperature between 240 and 280° C., preferably 260° C.

The wet chemical etching brings about etching in depth at the same time as unidirectional lateral etching under the mask, leading to the appearance of facets C 41 overhung by a mask cap attached to the top of the grooves, also called crenelations 43. The width of the grooves 40 and crenelations 43 depends on the chemical abrasion time. The distance between two facets C 41 formed during the etching step remains constant, equal to L2. The period L2 of the mask at the start (before etching) thus makes it possible to define the spacing between 2 facets C, after etching. The value of L2 is for example 10 μm. The time required for the coalescence of the seeds formed from the facets C depends on L2. In the case where growth is carried out by hydride vapour phase epitaxy (HYPE), the high rates of growth make it possible to increase L2 up to at least 1 mm.

The part of the mask overhanging the abraded area ("cap") is then removed by a cleaning procedure which comprises exposure of the substrate to an ultrasound bath for at least 1 minute in a bath which can be for example deionised water, acetone or isopropanol. The flanks of the mask obtained after this step are steep and do not encroach upon the facets C. The exposure of the substrate to an ultrasound bath after etching makes it possible to eliminate mask residues.

At the end of the texturing phase 1, a textured starting substrate 4 is obtained comprising grooves 40, each groove comprising a first inclined flank 41 of crystalline orientation C (0001) and a second inclined flank 42 of different crystalline orientation ($1\bar{1}01$), the crenelations 43 being covered by a mask with steep edges and not encroaching on the flanks of the sapphire. The presence of the mask on the upper facet r of the substrate 4 makes it possible to avoid any parasitic growth of GaN on the area covered by the mask 45.

The grooves 40 have a depth width/width ratio less than 1, or even less than 0.1. As an example, the grooves 40 of FIG. 2a have a depth of 200 nm for a width of 6000 nm. This dimensioning of the grooves 40 makes it possible to obtain facets of small dimension. The size of the facets (0001), linked to the depth of the groove 40, is for example 300 nm, but may advantageously be less than 300 nm in order to reduce the nucleation surface which can induce defects, and is preferably at least equal to 200 nm, but may be less. Chemical abrasion enables facets of small dimension to be obtained.

The mask 45 may be a mask made of dielectric or metal material. When the mask 45 is a dielectric mask, the constituent material is preferably of SiNx (SiN, $Si_3N_4$, etc.) or $SiO_2$ or TiN type. This makes it possible to minimise defects created at the mask edge and thus improves the quality of the gallium nitride layer epitaxied later thereon. When the mask 45 is a metal mask, the constituent material is preferably of tungsten (W) or molybdenum (Mo) or chromium (Cr) type. (It should be noted that in this case, the metal has to be protected by a dielectric during etching in an acid bath).

When the mask is of SiNx type, the deposition of the mask 45 may be carried out in a GaN growth chamber from silane and ammonia directly on the starting substrate. This deposition of the mask may be carried out by any other technique known to those skilled in the art.

For example, in an embodiment the step of deposition of the mask 45 (dielectric or metal) comprises:
- deposition of a layer (dielectric or metal) over the entire surface of the growth support, and etching the layer (dielectric or metal)—notably by photolithography—so as to define openings in the layer (dielectric or metal) exposing micrometric regions of the surface of the starting substrate.

The openings 44 defined during etching may be intermittent or in the form of strips. Advantageously, intermittent openings 44 may be inscribed in a circle of radius less than 10 micrometers, whereas openings 44 in strip form have a width less than 10 micrometers, the length of the strips only being limited by the dimensions of the starting substrate 4.

Preferably, the thickness of the mask layer 45 is at least equal to 200 nm. This makes it possible to block BSF stacking defects and a part of the dislocations present in the GaN crystals formed in the later phase of formation of GaN crystals. In particular, any defect area parallel to the facet C and of thickness d could be efficiently blocked by a mask of thickness e greater than or equal to d/cos($\alpha$), $\alpha$ being the angle that the facet c forms with the surface (cf. FIG. 11b).

1.2. GaN Crystal Formation Phase

Advantageously, the textured starting substrate 4 may comprise a first step 20 of nitridation comprising an annealing of the substrate 4 under ammonia NH3 atmosphere at a temperature greater than 900° C., preferably greater than 1000° C., during the implementation of phase 2 of formation of first GaN crystals 5. This makes it possible to facilitate any later step of deposition of GaN.

The phase 2 of formation of first GaN crystals 5 comprises a step 21 of deposition of a SiNx layer, preferably of a thickness less than ten single layers, on the starting substrate 4 for example by exposure to silane $SiH_4$ and to ammonia $NH_3$ at a temperature greater than 900° C., preferably greater than 1000° C., followed by a step 22 of deposition of a first buffer layer, for example of GaN.

The first buffer layer is deposited at low temperature (typically at a temperature less than 750° C.), for example by implementing the technique of deposition by metal organic vapour phase epitaxy (MOVPE) or hydride vapour phase epitaxy (HYPE). The thickness of the (first) buffer layer is preferably greater than 25 nm.

The first buffer layer is then heat treated to induce its migration to the level of the surfaces of the inclined flanks 41 of crystalline orientation C (0001) of the grooves 40 of the starting substrate 4.

More precisely, a step 23 of thermal annealing under hydrogen at a temperature greater than or equal to 950° C. is implemented to induce this migration and form first seeds of crystalline orientation C (0001) on the inclined flanks 41 of crystalline orientation C (0001) of the grooves 40 of the starting substrate 4.

A step 24A of growth of first GaN crystals 5 (for example by MOVPE or HVPE) is then implemented on the first seeds of GaN of crystalline orientation C (0001). This growth step 24A may be implemented at a temperature between 900° C. and 1300° C., at a pressure between 0.2 bars and 1 bar, i.e. between $0.2 \times 10^5$ Pa and $10^5$ Pa, and with a V/III ratio between 500 and 6000.

Preferably, within the context of a MOVPE reactor, the growth parameters for this step 24A may be: pressure between 0.5 bars and 1 bar (i.e. between $0.5 \times 10^5$ Pa and $1 \times 10^5$ Pa), temperature between 1080° C. and 1100° C., a V/III ratio between 1000 and 3500. These parameters obviously vary as a function of the reactors and the growth method adopted (MOVPE or HVPE).

Phase 2 consisting in forming first crystals 5 then comprises a step of oriented growth 24B to favour a rate of growth of first crystals 5 along the crystallographic planes (0001) greater than the rates of growth of first crystals 5 along planes perpendicular to (0001), such as the crystallographic planes (11$\bar{2}$0). On account of the oriented growth of first crystals 5 and due to the fact that this growth takes place on the facets, which are spaced apart from each other, triangular cavities 52 form between the substrate 4 and the first crystals 5, between the facets on account of the absence of growth of first crystals 5 on the substrate 4 between the facets.

Thus, during step 24B, the growth parameters (for example by MOVPE or HVPE) are adapted in order to favour the rate of growth of certain crystallographic planes compared to others. More precisely, the growth parameters are adapted to limit the rate of growth of first crystals 5 along the planes a (11$\bar{2}$0) compared to the rate of growth along other planes, and notably the planes C (0001) and (11$\bar{2}$2). This makes it possible to favour overlapping between adjacent first GaN crystals 5.

Notably, the step of oriented growth 24B may be carried out a pressure between 0.03 bars and 0.5 bars (i.e. between $0.03 \times 10^5$ Pa and $0.5 \times 10^5$ Pa), at a temperature between 900° C. and 1300° C. and with a V/III ratio between 250 and 3000. Preferably, the step of oriented growth 24B is carried out at a pressure between 0.1 bars and 0.5 bars (i.e. between $0.1 \times 10^5$ Pa and $0.5 \times 10^5$ Pa), at a temperature between 1000° C. and 1300° C. and with a V/III ratio between 500 and 3000.

This overlapping induces the blocking of crystal defects propagating through the first GaN crystals 5. A semiconductor material including a semi-polar GaN layer of high quality is thereby obtained.

The growth of first GaN crystals 5 is continued up to overlapping of the adjacent first GaN crystals 5. This overlapping may be made more pronounced by prolonging step 24B, which brings about the creation of extended cavities 53 between the crystals in the meeting plane at the end of overlapping. Preferably, the overlapping of the first crystals extends, in the direction of growth, over a distance greater than 1 µm.

Whereas the triangular cavities 52 are in contact with the substrate 4 and result from the oriented growth of first crystals 5 at areas localised at the facets, the extended cavities 53 result from the intersection of first crystals with each other.

Generally speaking, the extended cavities 53 are situated above the triangular cavities 52, since the triangular cavities are located at a level in which first crystals are not yet encountered, whereas the extended cavities 53 are situated at the level of this encounter.

These extended cavities assure complete blockage of defects encountering one of these cavities.

At the end of the step of growth of first GaN crystals 5, phase 2 of formation of first GaN crystals is terminated.

The method may be continued by implementing phase 3 of coalescence until a two-dimensional GaN layer is obtained. To obtain the two-dimensional GaN layer, the following growth conditions may for example be implemented: pressure between 0.03 and 0.8 bars (i.e. $0.3 \times 10^4$ Pa to $0.8 \times 10^5$ Pa), temperature between 1060° C. and 1080° C., and a V/III ratio between 1500 and 4000.

In a variant, the method may be continued by implementing a phase 2bis of formation of second GaN crystals 6 on the first GaN crystals 5. Phase 2bis comprises the same steps as phase 2, the growth conditions being chosen similar. The fact of repeating one or more times the steps of phase 2 makes it possible to improve further the crystalline quality of the GaN layer of the semiconductor material.

When phase 2bis of formation of second crystals is implemented, the method may comprise a step 25 of deposition of a SiNx layer on the first GaN crystals 5, by exposure to silane and NH3, at a temperature greater than 950° C. A step 26 of deposition of a second buffer layer is then carried out. This second buffer layer may be a GaN layer deposited under the same conditions as the first buffer layer (i.e. low temperature less than 750° C. by MOVPE or HYPE).

The second buffer layer is thermally annealed (step 27) to form second crystalline seeds at the surface of the first crystals 5, preferentially on the crystallographic planes c (0001) and a (11$\bar{2}$0) of the crystals 5. Preferably, the step consisting in thermally annealing 27 the buffer layer is implemented at a temperature greater than 950° C. under atmosphere comprising hydrogen to create second seeds on the faces a (11$\bar{2}$0) and c (0001) of the crystals 5.

A step 28A of growth of second GaN crystals 6 from second seeds is then implemented by MOVPE or HYPE.

Phase 2bis consisting in forming second crystals 6 comprises a step of oriented growth 28B to favour a rate of growth of second crystals 6 along the crystallographic planes (0001) greater than the rates of growth of second crystals 6 along planes perpendicular to (0001), such as the crystallographic planes (11$\bar{2}$0).

Thus, the step of oriented growth 28B is implemented following step 28A, in which the conditions of growth of second GaN crystals 6 are adapted such as to favour their growth along the planes c (0001) and (11$\bar{2}$2) and to slow down their growth along the planes a (11$\bar{2}$0). This makes it possible to favour overlapping between adjacent second GaN crystals 6.

Notably, the step of oriented growth 28B may be carried out at a pressure between 0.03 bars and 0.5 bars (i.e. between $0.03 \times 10^5$ Pa and $0.5 \times 10^5$ Pa), at a temperature between 900° C. and 1300° C. and with a V/III ratio between 250 and 3000. Preferably, the step of oriented growth 28B is carried out at a pressure between 0.1 bars and 0.5 bars (i.e. between $0.1 \times 10^5$ Pa and $0.5 \times 10^5$ Pa), at a temperature between 1000° C. and 1300° C. and with a V/III ratio between 500 and 3000.

Once overlapping of the crystals 6 has been obtained, this overlapping may once again be made more pronounced in order to form once again extended cavities 63 enabling complete blocking of defects encountering one of these cavities.

The method comprises a phase 3 of coalescence of the second GaN crystals 6 until a two-dimensional GaN layer is obtained, such as to obtain a semiconductor material including a semi-polar GaN layer of which the surface is substantially flat. To obtain the two-dimensional GaN layer, the following growth conditions may for example be implemented: pressure between 0.03 and 0.8 bars (i.e. $0.3 \times 10^4$ Pa to $0.8 \times 10^5$ Pa), temperature between 1060° C. and 1080° C., and a V/III ratio between 1500 and 4000.

At the end of phase 3, the semiconductor material comprises:
- a starting substrate 4—for example sapphire r (1$\bar{1}$02)—including grooves 40.
- a planar layer of semi-polar crystallographic orientation—, for example of orientation (11$\bar{2}$2), —including GaN crystals 5, 6, the adjacent crystals 5, 6 overlapping.

The only defects observed on the surface of the GaN layer of this semiconductor material are coalescence and dislocation joints of which the concentration is less than $1 \times 10^8$ cm$^{-2}$.

Advantageously, the starting substrate may be separated from the GaN layer by any separation technique known to those skilled in the art such as to obtain a semiconductor material including a self-supporting semi-polar GaN layer.

Different examples of implementation of the method described above will now be described.

2. EXAMPLES

2.1. Example 1

In the following example, the starting substrate on which the GaN layer is epitaxied is a disc of sapphire of 50.8 mm diameter, of crystallographic orientation r (1$\bar{1}$02). A first step of depositing a mask of dielectric SiO$_2$ or Si$_3$N$_4$ of 200 nm of thickness is carried out by photolithography methods. The mask is deposited in the form of strips parallel to the direction [11$\bar{2}$0] of the sapphire of 7 μm width and 3 μm opening.

This substrate may potentially be annealed at a temperature greater than 1000° C. in the presence of a gas such as H2, NH3, N2, for example.

The surface of the substrate is then etched in the form of parallel crenelations of 10 micron period. This texturing is obtained by chemical etching in an acid bath (H$_3$PO$_4$/H$_2$SO$_4$ in 1:3 volume proportion) taken to 260° C. As shown in FIG. 2a, each flank 41, 42 on either side of the crenelations 40 is inclined and corresponds to the crystallographic planes C (0001) and {1$\bar{1}$01} of the sapphire. The top of the crenelations 43 is covered by a layer 43 of dielectric SiO$_2$ or Si$_3$N$_4$ of 200 nm thickness, the residual part of the mask overhanging the abraded part of the sapphire having been removed by cleaning in acetone, isopropanol or H$_2$O baths exposed to ultrasounds.

The growth of GaN is carried out in a vapour phase epitaxy reactor by pyrolysis of organometallic compounds (MOVPE). The element Ga is provided by tri-methyl gallium (TMG) and the element N by ammonia (NH$_3$). These two precursor gases are thermally decomposed on the surface of the sapphire to form Ga—N bonds.

The first step consists in nitriding the substrate at 1080° C. by exposure for 7 min to a gaseous mixture (NH3, N2, H2), then depositing a SiNx layer by exposure to silane SiH4 and NH3.

The second step consists in depositing a buffer GaN layer of 27 nm at low temperature (580° C.).

Then the temperature is raised to 1100° C. During this phase, the buffer layer is redistributed by solid phase diffusion to the flanks 41 of crystallographic orientation C (0001) of the sapphire 4 to form seeds.

Figure 3:
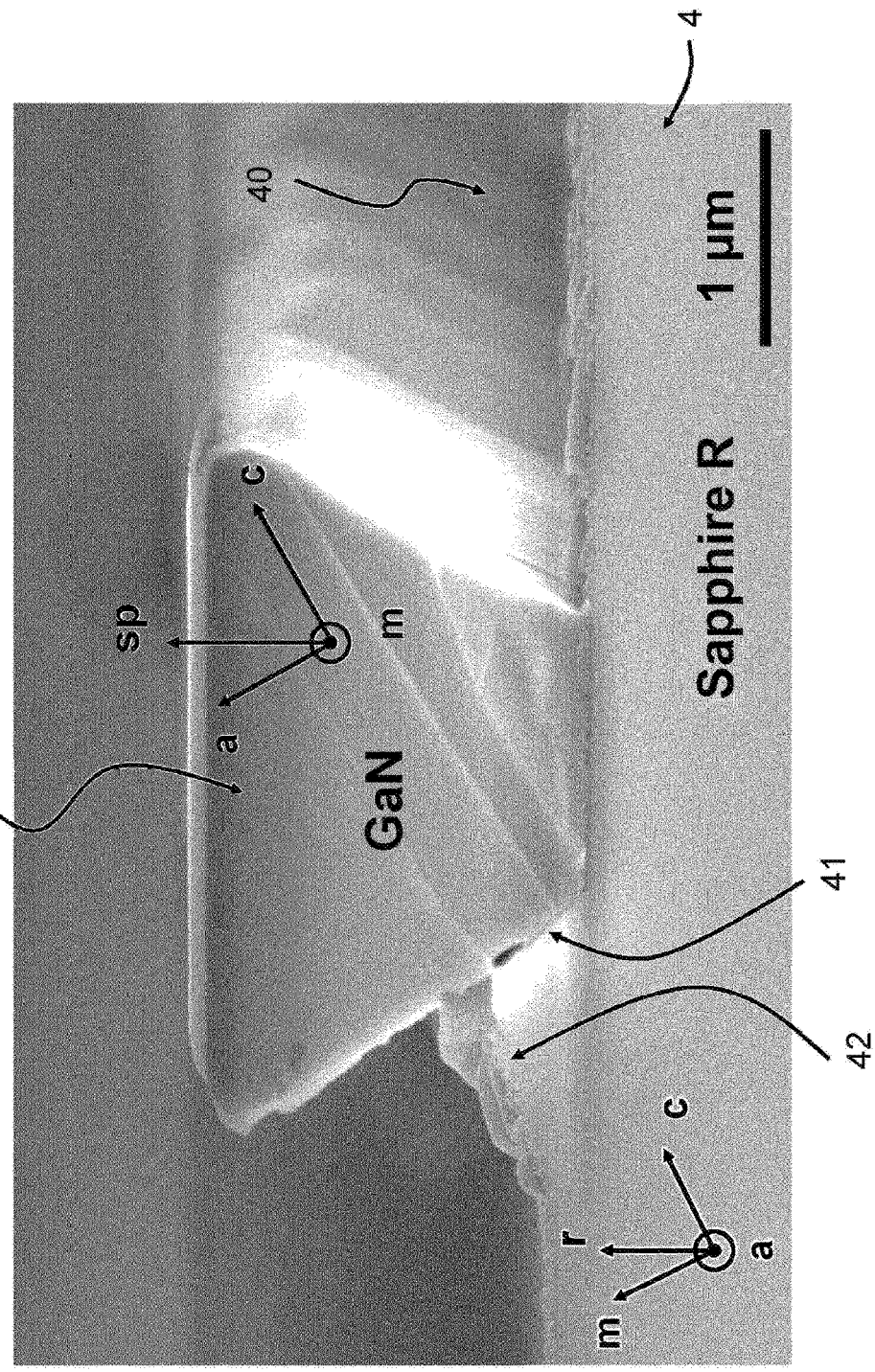
FIG. 3 is a scanning electron microscope (SEM) image in transversal section of a semi-polar GaN crystal of orientation (11$\bar{2}$2), after 10 minutes of growth.

The growth of GaN is then re-continued from seeds localised on the flanks 41 of crystallographic orientation C (0001). FIG. 3 illustrates the morphology of the GaN crystals 5 obtained after ten minutes of growth, under a pressure of 0.8 bars, i.e. $0.8 \times 10^5$ Pa at a temperature of 1080° C. and with a V/III ratio of 3500.

As illustrated in FIG. 3, the crystallographic orientation C (0001) of the GaN crystals 5 is parallel to the crystallographic orientation C (0001) of the sapphire 4. This epitaxy relation is similar to that of the growth of polar GaN (plane C) on polar sapphire (plane C). Since the flanks 41 of crystallographic orientation C (0001) of the sapphire 4 are inclined, the axis C (0001) of the GaN is also inclined with respect to a normal "sp" to the surface of the sapphire 4. This incline has an angle of around 58°, which indicates a semi-polar orientation (11$\bar{2}$2) of the GaN crystals. This orientation is confirmed by X-ray diffraction.

The growth of GaN crystals 5 is then continued, under a pressure of 0.1 bars (i.e. 0.1×10$^5$ Pa), at a temperature of 1100° C. and with a V/III ratio of 500, until overlapping thereof is obtained. By means of the growth conditions, the triangular shape of the GaN crystals 5 illustrated in FIG. 3 may be modified, in order to favour the rate of growth of GaN along certain crystallographic planes compared to others. It is notably possible to modify the pressure and the flow of ammonia in the reactor.

Figures 10A, 10B:
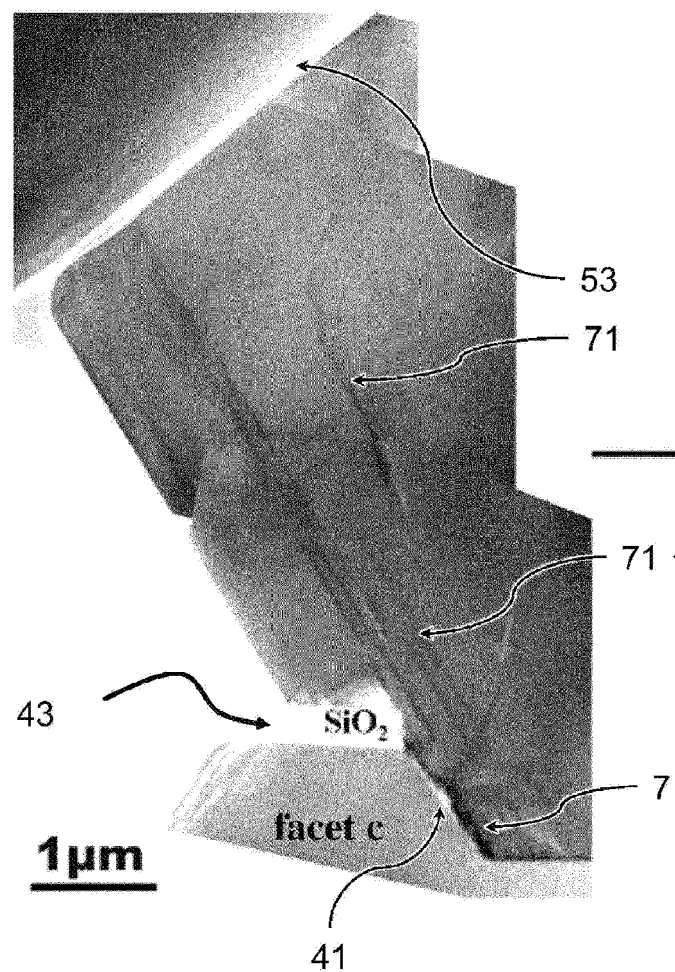

To better understand the advantages of the method according to the invention, FIGS. 4*a* to 4*d* illustrate different examples of growth of GaN on a textured 4 (FIGS. 4*b*-4*d*) or non-textured (FIG. 4*a*) sapphire. The lines 7 and 71 illustrated in FIGS. 4*a*-4*d* correspond respectively to stacking faults (hereafter designated BSF) and to dislocations. The BSF 7 are planar defects in the base plane (0001) of the hexagonal lattice cell, and the dislocations 71 are linear defects generated from the facet C and propagating at right angle, in the base plane (0001), as the TEM image of FIG. 10*a* shows.

Figure 4:
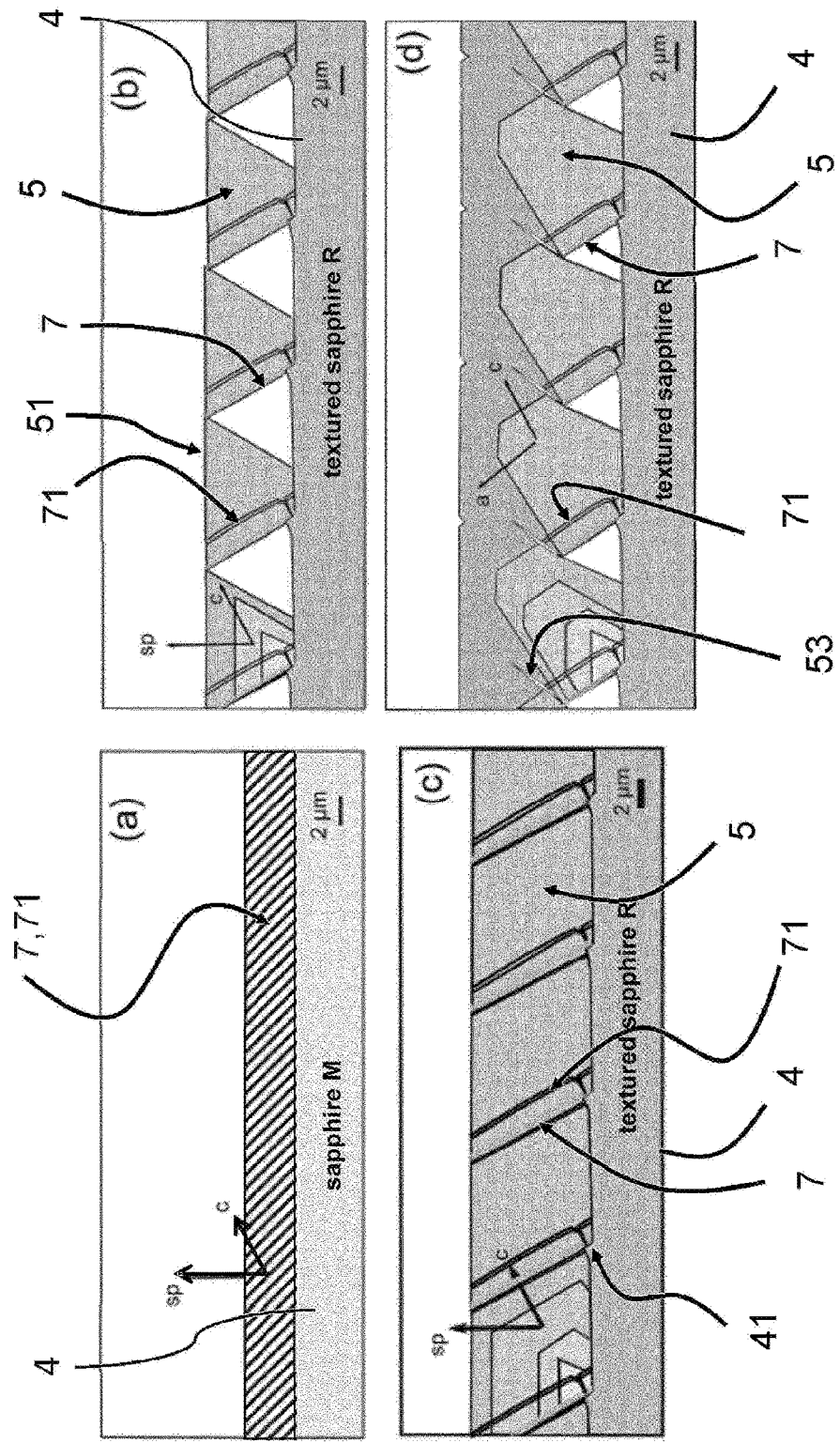
FIGS. 4a to 4d illustrate different examples of growth of a semi-polar GaN layer on a starting substrate.

FIG. 4*a* represents the case of planar epitaxy (i.e. non-localised) of semi-polar GaN (11$\bar{2}$2) on a non-textured sapphire 4 of crystallographic orientation m (1$\bar{1}$00). As may be observed in FIG. 4*a*, the BSF 7 represented by the black lines form at the interface between the sapphire substrate 4 and the GaN layer, and are spread out over the entire surface of the sapphire substrate. The surface density of the BSF 7 is very high. This density is typically of the order of 10$^5$ cm$^{-1}$. The dislocations associated with the BSF have a density of the order of 10$^{10}$ cm$^{-2}$.

FIGS. 4*b*, 4*c*, 4*d* illustrate the localised growth of semi-polar GaN crystals 5 from the flanks 41 of crystallographic orientation C (0001) of a textured sapphire 4. The BSF 7 are this time localised at the sapphire/GaN interface at the level of the flanks 41 of crystallographic orientation C (0001) of the sapphire 4, which considerably reduces their density. Due to the fact that growth takes place at the level of the facets C, certain dislocations 71 propagate in a direction normal to the facet then bend at right angle in the base plane (0001) (see TEM in FIG. 10*a*)).

Whereas in the examples illustrated in FIGS. 4*b* and 4*c*, the BSF 7 and the dislocations 71 propagate up to the surface 51 of the GaN layer, in the example illustrated in FIG. 4*d*, the BSF 7 and the dislocations 71 are blocked at the level of the junctions between adjacent crystals 5 due to their overlapping. The presence of extended cavities 53 in the coalescence region enables very efficient blocking of dislocations.

Thus, by choosing growth conditions where the rate of growth of the planes a (11$\bar{2}$0) is lower than the rate of growth of the planes C (0001), the overlapping of adjacent crystals 5 and the formation of cavities 53 is favoured, thus making it possible to block the BSF 7 and the dislocations 71. By implementing a growth of GaN crystals 5 as illustrated in FIG. 4*d*, it is thus possible to filter the BSF 7 and most of the dislocations 71 such as to improve the quality of the GaN layer.

Figure 5:
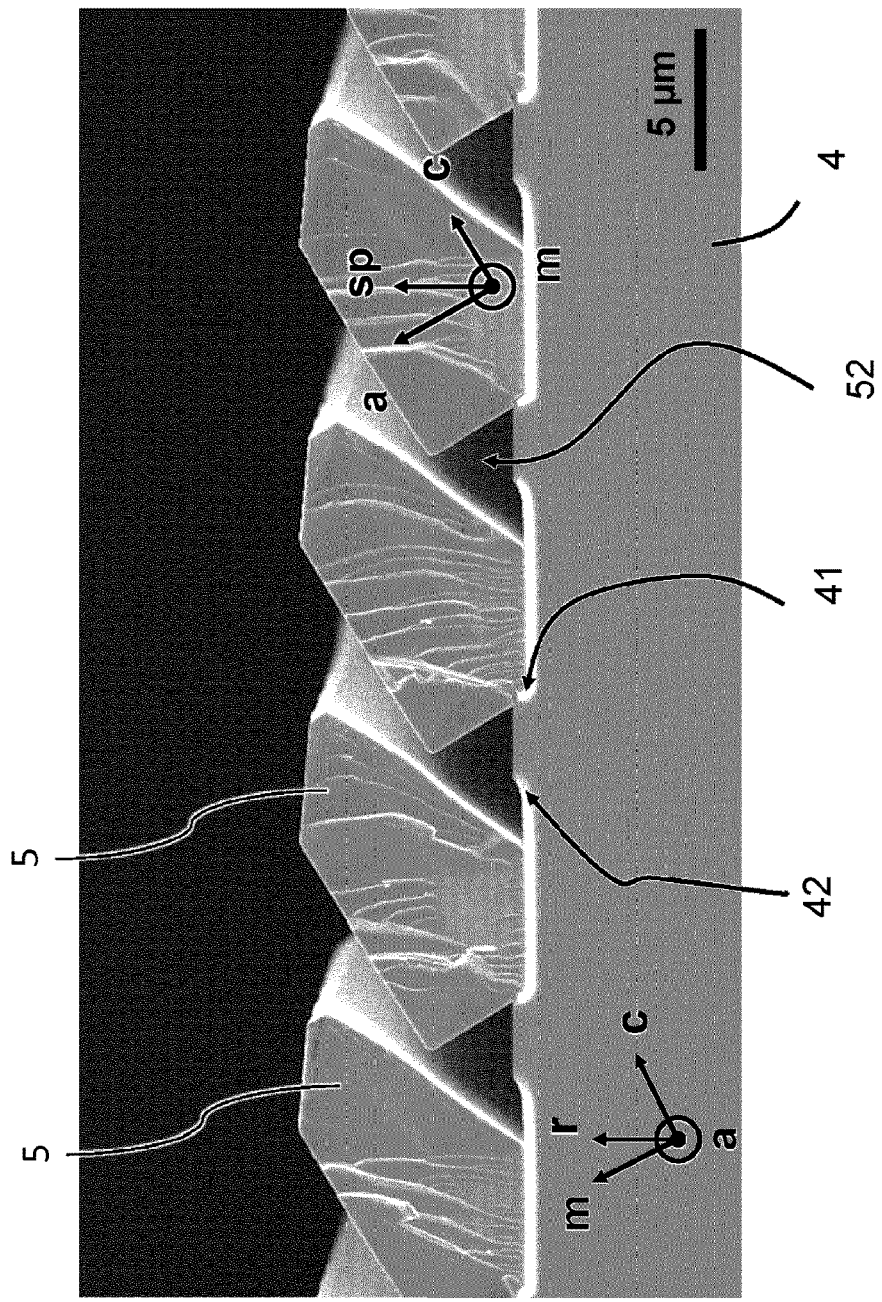
FIG. 5 is an SEM image in transversal section of overlapping III-nitride crystals obtained after 1.5 h of growth.

The increase in the crystals 5 according to the example illustrated in FIG. 4*d* was produced experimentally for conditions of low pressure and low ammonia flow. FIG. 5 is a scanning electron microscopy image in transversal section of the GaN crystals 5 obtained after 1.5 h of growth under a pressure of 0.1 bars, i.e. 0.1×10$^5$ Pa, a temperature of 1100° C. and a V/III ratio of 500. As may be seen in FIG. 5, the overlapping of adjacent crystals 5 favours blocking of the BSF 7 and the dislocations 71.

After the overlapping of the GaN crystals 5, the growth is continued for around 2 hours, under a pressure of 0.1 bars (i.e. 0.1×10$^5$ Pa), a temperature of 1060° C. and a V/III ratio of 3000, such as to obtain a two-dimensional GaN layer having a smooth surface.

FIG. 6 illustrates the morphology of the coalesced GaN layer. Triangular cavities 52 may be noted at the sapphire/GaN interface, periodically spaced apart every 10 microns, which stem from the localised growth mode described previously. The presence of extended cavities 53 at the intersection between two adjacent crystals may also be noted. These cavities are favourable to the blocking of crystal defects, as shown by the TEM image of FIG. 10*a*).

The quality of this GaN layer has been evaluated by photoluminescence (PL) and cathodoluminescence (CL).

FIG. 7 illustrates first and second photoluminescence PL spectra 81, 82. The first spectrum 81 corresponds to the PL spectrum at 16K of semi-polar GaN obtained by implementing the method according to the invention. The second spectrum 82 corresponds to the PL spectrum of polar GaN serving as reference.

As may be seen, the spectra 81, 82 are dominated by an intense emission around 3.48 eV corresponding to excitonic transmissions of GaN. It may be noted firstly that the PL intensities around 3.48 eV are equivalent in the first and second spectra. This is a first indication that the densities of non-radiating defects in the semi-polar GaN and the polar GaN are of the same order of magnitude. The spectra do not have any emission around 3.43 eV, characteristic of transitions linked to BSF.

FIGS. 8*a* and 8*b* are panchromatic cathodoluminescence (CL) images at 77K of the distribution of luminescence on the trench and at the surface of the semi-polar GaN obtained by implementing the method according to the invention.

The dark areas correspond to an absence of luminescence associated with the presence of non-radiating defects. These images thus give direct information on the distribution of defects. The blocking of BSF is highlighted in FIG. 8*a*. In fact, these defects emit a luminescence around 3.43 eV at the measurement temperature (77K). The BSF 7 of a crystal are blocked directly in line with an adjacent crystal. FIG. 8*b* illustrates coalescence joints 72 induced by the localised epitaxy regularly spaced apart by a distance of 10 microns. Non-radiating points corresponding to dislocations 71 emerging at the surface and associated with through dislocations may also be observed. A counting of these dislocations 71 between two coalescence joints 72 shows a density between 4.9×10$^7$ cm$^{-2}$ and 5.7×10$^7$ cm$^{-2}$. This density is an order of magnitude less than that of the layers of polar GaN epitaxied on a sapphire plane C.

The TEM image of FIGS. 9*a* and 9*b* shows the distribution of defects emerging at the surface of a coalesced layer of semi-polar GaN. FIGS. 9*a* and 9*b* represent the same image, with however for FIG. 9*b* the highlighting by visual markers of the defects visible in FIG. 9*a*, with squares and circles. The circles correspond to through dislocations 71 and the squares correspond to BSF 7. A counting of these defects shows a dislocation density of 6.8×10$^7$/cm$^2$ and a BSF density of 69/cm, the latter density being obtained by adding together the length of the BSFs and by dividing this quantity by the counting surface.

The diagram of FIG. 10*b* shows the development of a seed of GaN during growth from the facets C 41 of the sapphire 4. The black lines correspond to through dislocations 71 and the dotted lines represent the crystal in intermediate growth states. When a through dislocation 71 encounters an inclined facet, it bends towards the new free surface, and finishes by propagating at right angle, in the base plane (0001). This curvature process is demonstrated by the TEM image of FIG. 10a. A network of dislocation lines propagating vertically from the interface, then bending at 90° in the direction a [11$\bar{2}$0] may clearly be observed. These dislocations 71 are stopped at the level of the empty space 53 created at the intersection of two adjacent crystals.

Furthermore, the BSF 7 confined in the base plane (0001) (black area of thickness ~30 nm), are stopped by the SiO$_2$ mask.

Figure 11B:
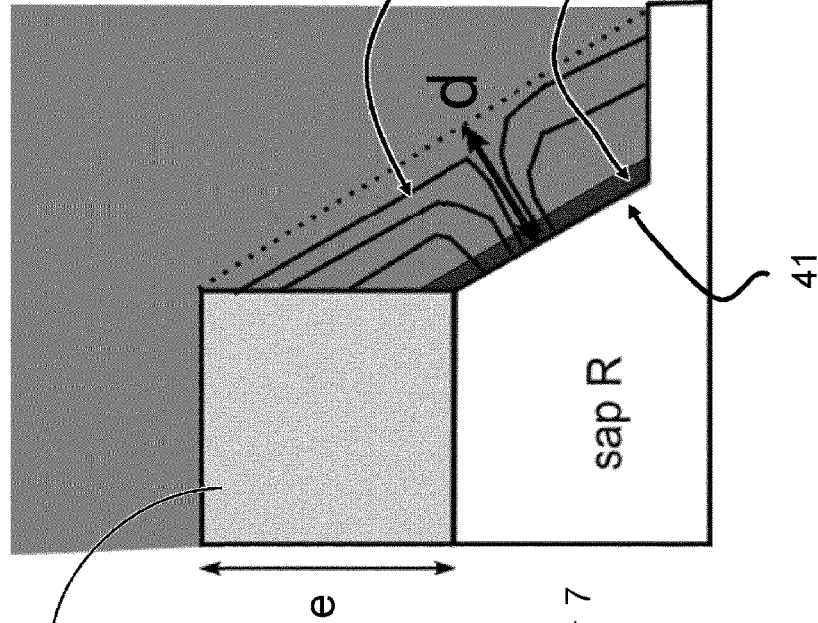
FIG. 11b is a diagram illustrating the blocking of crystal defects by the mask.
Figure 11A:
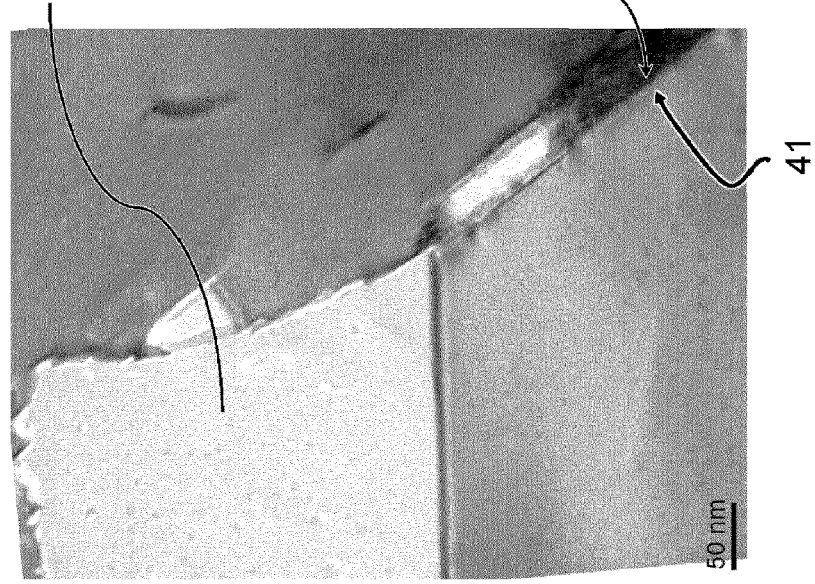
FIG. 11a is a TEM image of a region close to the facet c.

FIG. 11a shows a TEM image of the region close to the facet C 41 of the sapphire. It will be noted that the mask 43, of thickness ~300 nm, plays a very efficient role in the blocking of BSFs 7.

FIG. 11b shows that by increasing the thickness of the mask, it is possible to block a larger quantity of crystal defects, including curved dislocations 71. Thus, an area of defects of thickness d could be potentially blocked by a mask having a thickness e of at least around d/cos($\alpha$), with $\alpha$=58.4°, i.e. around 2 d, in the case of GaN (11$\bar{2}$2).

The surface roughness (RMS) measured by AFM is 4 nm for the tested surfaces of 10×10 µm$^2$. This value is acceptable for producing optoelectronic components without having to carry out prior polishing. An undulation of the surface is observed in the direction [1$\bar{1}$00], parallel to the coalescence joints. This undulation may be eliminated by chemical-mechanical polishing to attain a roughness less than a nm, if necessary, for industrial exploitation.

2.2. Example 2

The preceding example shows that localised epitaxy of GaN from the facets c of the textured sapphire r (11$\bar{2}$2) makes it possible to obtain semi-polar GaN of orientation (11$\bar{2}$2) with low defect density.

To further improve the crystalline quality of the semi-polar GaN, the principle of blocking crystal defects by overlapping of crystals is repeated twice.

FIG. 12 illustrates the growth of second crystals 6 above the first crystals 5, by the method described above. The second crystals 6 are obtained after having:
- deposited a single SiNx layer on the first crystals 5,
- deposited a second buffer GaN layer (30 nm) at 580° C.,
- heat treated the second buffer layer,
- carried out a growth of second GaN crystals 6 at high temperature (1100° C.) for 25 minutes at 0.8 bars, under a standard flow of NH$_3$ of 3.5 liters per minute, noted slm (standard liter per minute), with a V/III ratio=3500.

It will be noted that nucleation takes place selectively on the facets a and c of the first crystals 5.

Figure 13:
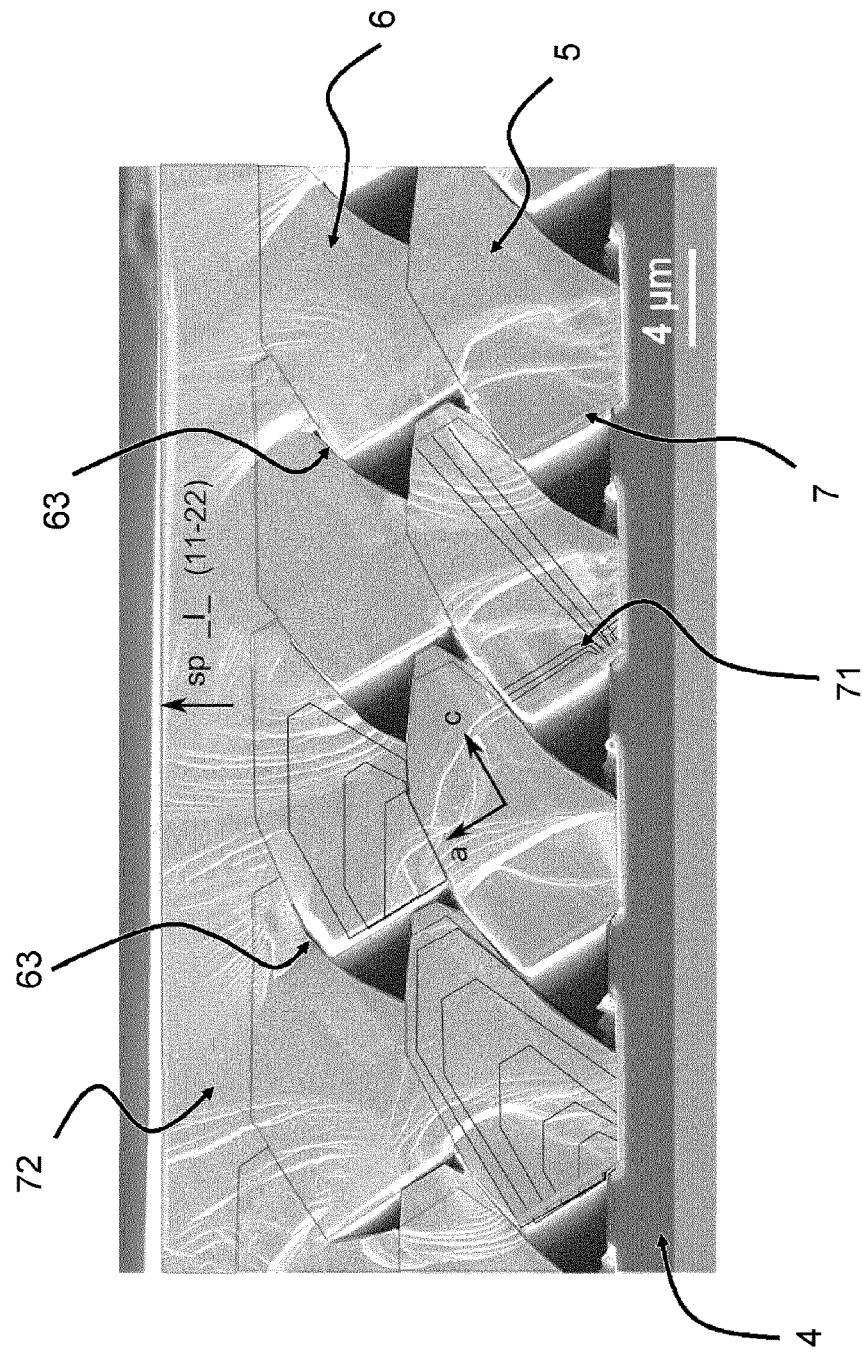

From these seeds, at the same time the flow of ammonia is reduced to 0.5 standard liters per minute and the pressure in the reactor to 0.1 bars, and growth is continued for 2 hours. These growth conditions favour the lateral expansion of the crystals towards the direction c (asymmetric growth). The morphology of the final coalesced structure is represented in FIG. 13. It should be noted that the growth conditions during the 1$^{st}$ step (first crystals) and the 2$^{nd}$ step (second crystals) are the same.

The objective of this technique of growth of first and second crystals 5, 6 is to filter more defects. During the phase of growth of the first crystals, the stacking faults and curved dislocations that are generated at the interface between the facet c of the sapphire and the nucleation layer of a first crystal are well stopped by the empty space 53 left by the encounter of the crystallographic planes of adjacent crystals.

On the other hand, through dislocations in the direction normal to the facet c are free to propagate on the surface, as well as dislocations generated at the coalescence joints. These defects are potentially blocked by the second plane of triangular cavities that form during the phase of growth of second crystals.

During this phase of growth of second crystals, BSF 7 may be created at the interface with the facets a of the underlying crystal and the buffer layer. These defects are once again blocked by the extended cavities 63 which form with the neighbouring crystal thanks to asymmetric growth.

Figure 14:
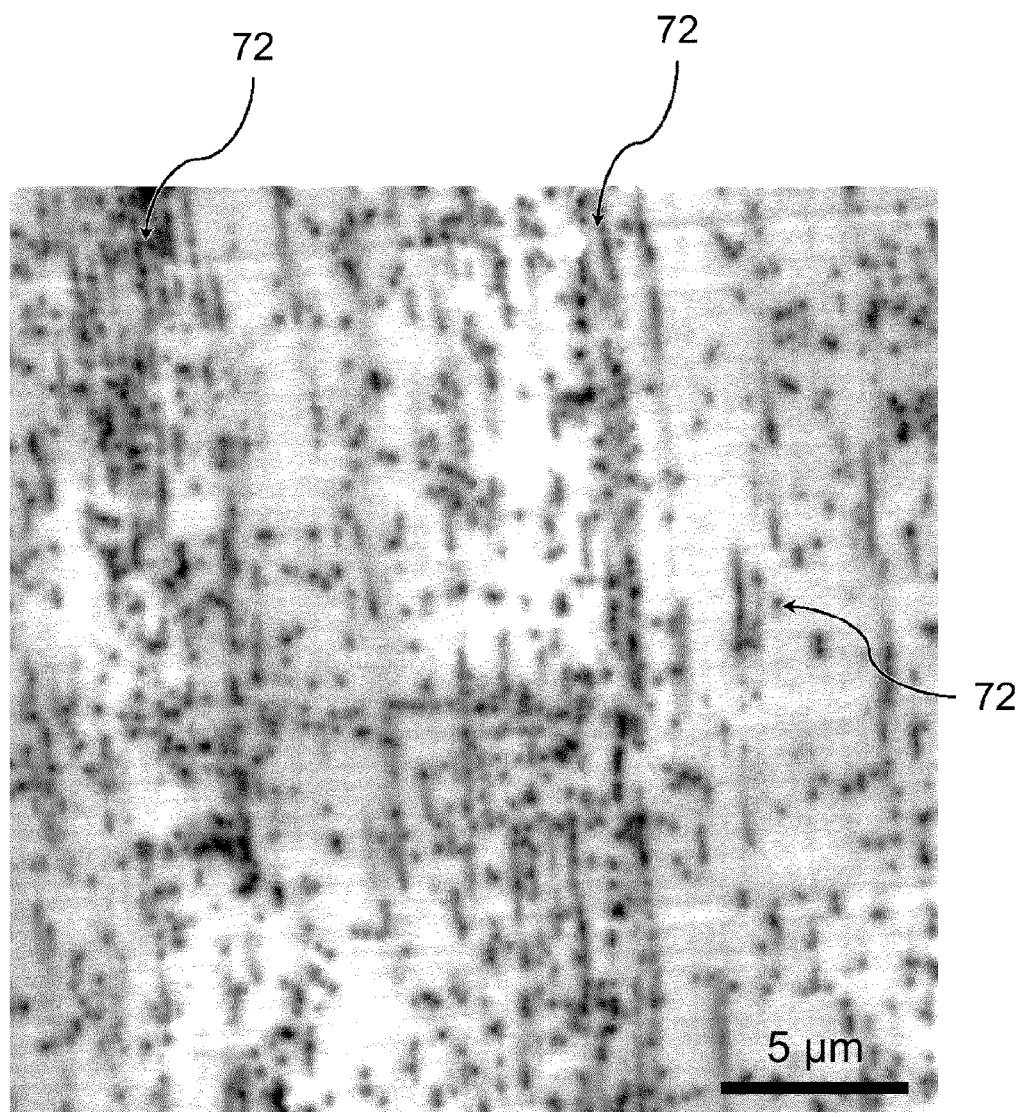
FIG. 14 is a cathodoluminescence image at 77K of the surface of the GaN layer corresponding to FIG. 13.

After phase 3 of coalescence of the crystals 6, the surface was analysed by panchromatic cathodoluminescence (CL). FIG. 14 shows the cathodoluminescence at 77K of the surface.

At this temperature, the BSF emit an intense luminescence around 3.41 eV. No luminescence associated with BSF is observed at the surface, which proves that the filtering of these defects has been efficient. The defects present are exclusively through dislocations 71. The coalescence joints 72 which appear under the aspect of contrasted black lines in the example 1 (FIG. 8b), are here difficult to see.

The method of growth of first and second crystals results in a more homogenous distribution of surface defects. The black spot density is here 1.7×10$^8$ cm$^{-2}$.

If this type of substrate is used for the epitaxy of optoelectronic components, an inhomogeneous distribution of surface defects may induce instabilities, such as leakage currents, hot points, etc.

Consequently, the two step method of growth of crystals (i.e. first and second crystals) may bring an improvement in this field.

Figure 15:
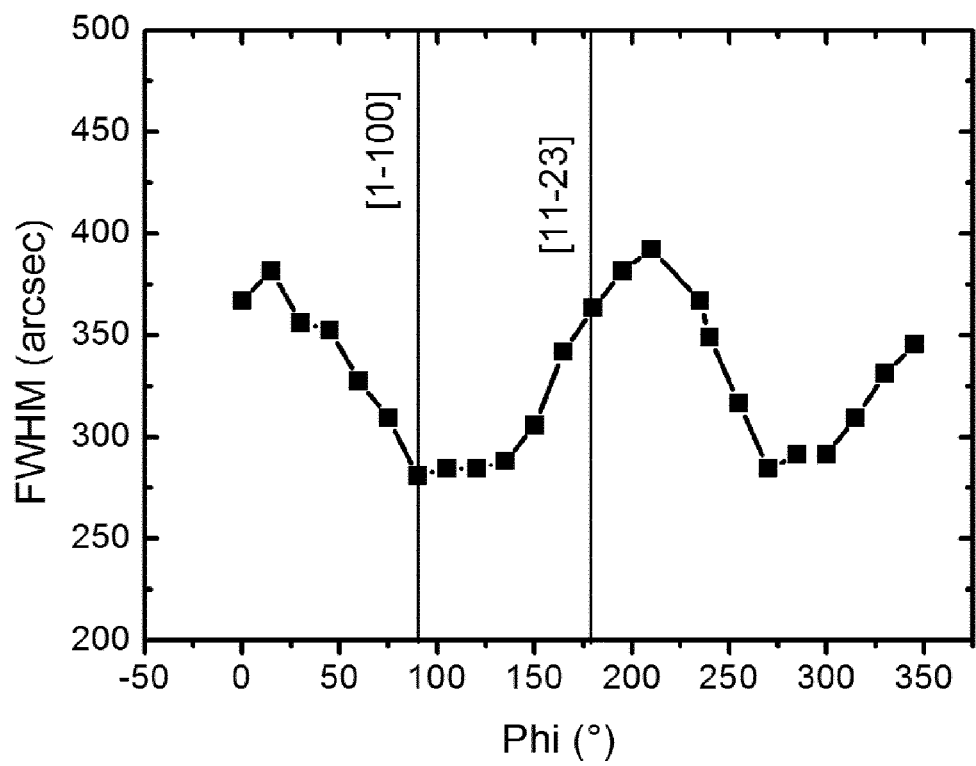
FIG. 15 shows the measurement of the full width at half maximum of the intensity diffracted by the planes (11$\bar{2}$2) when the sample is inclined on either side of an axis perpendicular to the planes (11$\bar{2}$2).

FIG. 15 shows the measurement of the full width at half maximum (FWHM), of the intensity diffracted by the planes (11$\bar{2}$2) when the sample is inclined on either side of an axis perpendicular to the planes (11$\bar{2}$2), designated "rocking curve". This measurement is carried out for each azimuthal angle, that is to say the angle that the incidence plane of the X-rays makes with the crystallographic direction in the plane of the layer.

At phi=90°, the incidence plane of the X-rays is parallel to the direction [1$\bar{1}$00] (direction along the strips). The fluctuations of FWHM bear witness to crystalline anisotropy in the plane of the layer. The FWHM values are less than 400 arc seconds.

Thus, the III-nitride layer is characterised by a curve of X-ray diffraction intensity of the crystallographic planes {11-22} as a function of the angle of incidence of the X-ray beam on these planes having a full width at half maximum less than 400 arc seconds.

It should be noted that these semi-polar substrates may also be used to produce self-supporting substrates, that is to say a semi-polar layer separated from the host substrate 4. The separation may take place for example during or at the end of phase 3 of coalescence of the crystals until formation of a two-dimensional III-nitride layer, for example by thickening of the upper coalesced layer by the HVPE technique, which enables high growth rates.

It should be noted that in so far as the III-nitride layer is only connected to the substrate 4 through the intermediary of facets, of reduced dimension, adhesion to the substrate 4 is low, and mechanical stresses during thickening and/or cooling may suffice to induce separation.

In this case, a notable reduction in defects may be expected. In fact, thickening brings about a significant reduction in the number of dislocations. During growth, certain through dislocations bend and cancel each other out by forming loops.

With the aim of obtaining self-supporting semi-polar GaN, the layers obtained by the two step method may prove to be more appropriate. In fact, the presence of triangular cavities in two stages should induce additional embrittlement during HVPE thickening, beneficial for disbondment of GaN from the host substrate (sapphire).

The invention claimed is:

1. Method for manufacturing a semiconductor material including a semi-polar III-nitride layer from a starting substrate including a plurality of grooves periodically spaced apart by a distance L2, each groove including a first inclined flank of crystallographic orientation C (0001) and a second inclined flank of different crystallographic orientation, a first inclined flank of a groove and a second inclined flank of an adjacent groove forming a crenelation having a top overhung by a mask cap,
the method comprising the phases consisting in:
    forming first III-nitride crystals on the first inclined flanks of the grooves, the growth parameters of the first III-nitride crystals being adapted to favor lateral growth of said first III-nitride crystals:
        the growth firstly inducing triangular cavities formed between the substrate and two adjacent first III-nitride crystals, a triangular cavity having a base, two walls and a vertex, the base corresponding to the substrate, a wall corresponding to a first III-nitride crystal, another wall corresponding to said adjacent first III-nitride crystal, and the vertex corresponding to a beginning of intersection between said two adjacent first III-nitride crystals, a presence of the mask cap avoiding parasitic growth on the area covered by the mask,
        and then inducing an overlapping between adjacent first III-nitride crystals, forming extended cavities situated above the triangular cavities, starting from the vertex of the triangular cavities and in line with the overlapping areas between the first III-nitride crystals in meeting planes between the first III-nitride crystals, at an intersection between two adjacent overlapping first III-nitride crystals;
    forming a two-dimensional III-nitride layer on III-nitride crystals formed beforehand.

2. Method according to claim 1, which further comprises a phase consisting in forming second III-nitride crystals on the first III-nitride crystals, the growth parameters of the second III-nitride crystals being adapted to favor lateral growth of said second III-nitride crystals to induce overlapping between adjacent second III-nitride crystals and to form cavities in line with the overlapping areas of the second III-nitride crystals.

3. Method according to claim 1, in which growth of the first III-nitride crystals is carried out by metal organic vapour phase epitaxy MOVPE or by hydride vapour phase epitaxy HVPE, and the formation of a two-dimensional III-nitride layer is carried out by metal organic vapour phase epitaxy MOVPE, by hydride vapour phase epitaxy HVPE or by molecular beam epitaxy.

4. Method according to claim 1, which further comprises a phase consisting in texturing the starting substrate, said phase including a step consisting in forming the plurality of grooves in the starting substrate.

5. Method according to claim 4, in which the step consisting in forming the plurality of grooves comprises the sub-steps of:
    depositing a mask of period L2 including openings,
    annealing the starting substrate comprising the mask at a temperature greater than 900° C. under atmosphere comprising ammonia NH3 and/or a dihydrogen-dinitrogen H2/N2 mixture, prior to chemical etching in an acid bath,
    etching the starting substrate through the openings of the mask, by introduction of the starting substrate in an acid bath to form grooves.

6. Method according to claim 5, in which the etching sub-step comprises:
    dry etching the substrate by reactive ion etching, preceded or followed by annealing under NH3, H2, N2, and
    wet etching the substrate at 260° C.

7. Method according to claim 5, in which the parameters of the step of etching the substrate are adapted to form grooves of width greater than the initial openings, thanks to lateral abrasion under the mask to form abraded areas, said grooves each including an inclined first flank of crystallographic orientation C (0001) and a second inclined flank of crystallographic orientation different to a plane C (0001).

8. Method according to claim 7, in which the parts of the mask overhanging the abraded areas are removed by a cleaning procedure comprising treatment in an ultrasound bath, such that at the end of the cleaning procedure, the substrate comprises on its surface strips of mask with substantially vertical flanks and grooves.

9. Method according to claim 5, in which the sub-step of depositing a mask comprises the deposition of a dielectric layer, such as a layer of SiOx, or SiNx, or a metal layer, and etching the mask to form openings.

10. Method according to claim 5, in which the thickness of the mask layer is between 200 nm and 100 micrometers such as to block crystal defects generated from the inclined flanks.

11. Method according to claim 1, in which the phase consisting in forming first III-nitride crystals comprises the steps consisting in:
    depositing a III-nitride buffer layer by metal organic vapour phase epitaxy MOVPE of a III-nitride layer at a temperature less than 750° C.;
    thermally annealing the buffer layer at a temperature greater than 950° C. under atmosphere comprising hydrogen such as to bring about the solid phase migration of the buffer layer to the first inclined flank of orientation C of each groove and thereby forming first seeds of crystallographic orientation C (0001) on the first flanks of the grooves.

12. Method according to claim 11, in which the phase consisting in forming first III-nitride crystals comprises a step consisting in growing first III-nitride crystals on the first seeds, and in which the step consisting in growing first III-nitride crystals is implemented at a temperature between 900° C. and 1300° C., at a pressure between $0.2 \times 10^5$ Pa and $1 \times 10^5$ Pa.

13. Method according to claim 12, in which the phase consisting in forming first III-nitride crystals comprises a step of oriented growth to favour a rate of growth of the first III-nitride crystals along crystallographic planes (0001) greater than the rates of growth of the first III-nitride crystals along planes perpendicular to (0001), such as the crystallographic planes (1120).

14. Method according to claim 2, in which the phase consisting in forming second III-nitride crystals comprises the steps consisting in:
- depositing a second SiNx layer on the pre-existing first III-nitride crystals, by exposure to silane and NH3, at a temperature greater than 950° C.,
- depositing at a temperature less than 750° C. a second III-nitride buffer layer on the second SiNx layer,
- thermally annealing the second buffer layer at a temperature greater than 950° C. under atmosphere comprising hydrogen such as to bring about the solid phase migration of the buffer layer to the faces a ($11\bar{2}0$) and c (0001) of the crystals, and thereby to form second seeds on the faces a ($11\bar{2}0$) and c (0001) of the first III-nitride crystals.

15. Method according to claim 14, in which the phase consisting in forming second III-nitride crystals comprises a step consisting in growing second III-nitride crystals on the second seeds, implemented at a temperature between 900° C. and 1300° C., at a pressure between $0.2 \times 10^5$ Pa and $1 \times 10^5$ Pa.

16. Method according to claim 15 in which the phase consisting in forming the second III-nitride crystals comprises a step of oriented growth to favour a rate of growth of the second crystals along crystallographic planes (0001) greater than the rates of growth of the III-nitride second crystals along planes perpendicular to (0001), such as the crystallographic planes ($11\bar{2}0$).

17. Method according to claim 1, in which the starting substrate is a sapphire substrate of crystallographic orientation r ($1\bar{1}02$) having a disorientation with respect to the nominal plane being able to be 3°.

18. Semiconductor material including a semi-polar GaN layer, self-supporting or epitaxied on an exogenous substrate, the semiconductor material comprising a semi-polar GaN layer including coalesced III-nitride crystals and triangular cavities formed between the substrate and the III nitride crystals, wherein adjacent III-nitride crystals are overlapping, wherein said semiconductor material comprises, after coalescence of the overlapping III-nitride crystals, extended cavities in meeting planes between the III-nitride crystals, at an intersection between two adjacent III-nitride crystals, and in which each extended cavity situated above the triangular cavities extends in line with the overlapping areas between the III-nitride crystals.

19. Semiconductor material according to claim 18, in which each extended cavity extends in a plane that overhangs at least a plane defined by a crystallographic facet (0001) of the substrate.

20. Semiconductor material according to claim 18, in which the III-nitride layer comprises a curve of X-ray diffraction intensity of the crystallographic planes {11-22} as a function of the incidence angle of the X-ray beam on these planes having a full width at half maximum less than 400 arc seconds.

21. Semiconductor material according to claim 18, obtained by the method of claim 1, said semiconductor material having a dislocation density less than or equal to $1.3 \times 10^8$ cm$^{-2}$, preferably even less than $7 \times 10^7$ cm$^{-2}$.

22. Semiconductor material according to claim 18, obtained by the method of claim 1, said semiconductor material having a density of non-radiating centers measured by cathodoluminescence less than or equal to $1.1 \times 10^8$ cm$^{-2}$, preferably even less than $5 \times 10^7$ cm$^{-2}$.

23. Semiconductor material according to claim 18 obtained by the method of claim 1, said semiconductor material having a stacking fault density determined by a transmission electron microscopy measurement less than or equal to $1 \times 10^3$ cm$^{-1}$, preferably less than or equal to 70 cm$^{-1}$.

* * * * *